(12) United States Patent
Lee et al.

(10) Patent No.: US 8,144,503 B2
(45) Date of Patent: Mar. 27, 2012

(54) INFORMATION STORAGE DEVICE AND METHOD OF OPERATING THE SAME

(75) Inventors: Sung-chul Lee, Osan-si (KR); Sun-ae Seo, Hwaseong-si (KR); Young-jin Cho, Suwon-si (KR); Ji-young Bae, Seongnam-si (KR); Ung-hwan Pi, Seoul (KR); Hyung-soon Shin, Seoul (KR); Seung-jun Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 175 days.

(21) Appl. No.: 12/457,908

(22) Filed: Jun. 25, 2009

(65) Prior Publication Data

US 2010/0157663 A1    Jun. 24, 2010

(30) Foreign Application Priority Data

Dec. 24, 2008  (KR) .................. 10-2008-0133836

(51) Int. Cl.
*G11C 11/00*    (2006.01)

(52) U.S. Cl. ....................................................... 365/158
(58) Field of Classification Search .................... 365/158
See application file for complete search history.

(56) References Cited

U.S. PATENT DOCUMENTS

2008/0080234 A1 *    4/2008    Iwata et al. .................... 365/171

FOREIGN PATENT DOCUMENTS

| KR | 10-0695171 | 3/2007 |
| KR | 10-0718153 | 5/2007 |
| KR | 10-0754397 | 8/2007 |

* cited by examiner

*Primary Examiner* — Hoai V Ho
*Assistant Examiner* — Anthan Tran
(74) *Attorney, Agent, or Firm* — Harness, Dickey & Pierce, P.L.C.

(57) ABSTRACT

An information storage device includes a memory region having a magnetic track and a write/read unit, and a control circuit connected to the memory region. First and second switching devices are connected to both ends of the magnetic track, and a third switching device is connected to the write/read unit. The control circuit controls the first to third switching devices, and supplies operating current to at least one of the magnetic track and the write/read unit.

23 Claims, 22 Drawing Sheets

INFORMATION STORAGE DEVICE AND METHOD OF OPERATING THE SAME

CROSS-REFERENCE TO RELATED APPLICATIONS

This application claims the benefit of Korean Patent Application No. 10-2008-0133836, filed on Dec. 24, 2008, in the Korean Intellectual Property Office, the disclosure of which is incorporated herein in its entirety by reference.

BACKGROUND

1. Field

One or more example embodiments relate to information storage devices and methods of operating the same.

2. Description of the Related Art

Conventional non-volatile information storage devices, which retain recorded information when power is cut off, include hard disk drives (HDDs) and non-volatile random access memories (RAMs), etc.

In general, a conventional HDD may wear down due to a rotating mechanical device included in the HDD and may experience an operational failure, thereby reducing reliability. Meanwhile, an example of a conventional non-volatile RAM is flash memory. Although the flash memory does not use a rotating mechanical device, the flash memory has low reading and writing speeds, a short lifetime, and a smaller storage capacity than the HDD. Also, the flash memory has relatively high manufacturing costs.

In order to avoid these characteristics of non-volatile information storage devices, a new type of information storage device that uses movement of a magnetic domain wall is currently being researched and developed. A magnetic domain is a minute magnetic region formed of a ferromagnetic material, in which magnetic moments are arranged in a specific direction. A magnetic domain wall is a border region between magnetic domains having different magnetization directions. The magnetic domain and the magnetic domain wall may move by supplying current to the magnetic material.

However, information storage devices using magnetic domain wall movement are still at an early stage of development. Furthermore, most of research into such information storage devices is limited to unit storage regions.

SUMMARY

One or more embodiments include an information storage device using movement of magnetic domains and magnetic domain walls.

One or more embodiments include a method of operating the information storage device.

Additional aspects will be set forth in part in the description which follows and, in part, will be apparent from the description, or may be learned.

One or more embodiments may include an information storage device including a magnetic track including a plurality of magnetic domain regions and magnetic domain wall regions between adjacent magnetic domain regions. A write/read unit is included in a first region of the magnetic track, where first and second electrodes are disposed at both ends of the write/read unit. First and second switching devices are respectively connected to both ends of the magnetic track. A third switching device is connected to the first electrode of the write/read unit. A circuit controls the first to third switching devices and supplying current to at least one of the magnetic track and the write/read unit.

The first to third switching devices may be transistors.

Gates of the first and second switching devices may be connected to a first word line, and a gate of the third switching device may be connected to a second word line.

The device may further include first through fourth bit lines intersecting the first and second word lines. The first bit line may be connected to the first switching device, the second bit line may be connected to the third switching device, the third bit line may be connected to the second electrode of the write/read unit, and the fourth bit line may be connected to the second switching device.

The circuit may include a first circuit connected to the first and second word line and a second circuit connected to the first through fourth bit line.

The second circuit may include first through fourth signal generators being respectively connected to the first through fourth bit lines. A read operation performed on the first region including the write/read unit may be controlled by the first and second signal generators, a write operation performed on the first region under may be controlled by the second and third signal generators, and movement of magnetic domain walls in the magnetic track may be controlled by the first and fourth signal generators.

The first circuit may turn on the first to third switching devices during the read operation, turn on the third switching device during the write operation, and turn on the first and second switching devices during the movement of the magnetic domain walls.

The first signal generator may include a first moving-current source connected to a first interconnecting wire that is connected to the first bit line. A first transistor is disposed between the first moving-current source and the first interconnecting wire. Second and third transistors are connected in parallel to the first interconnecting wire, where one end of the second and third transistors is grounded. A first AND gate has an output terminal connected to the second transistor and first and second input terminals. A second AND gate has an output terminal connected to the first transistor, and first and second input terminals which are respectively connected to the first and second input terminals of the first AND gate. A first inverter is disposed between the second input terminals of the first and second AND gates, wherein moving signals for moving the magnetic domain walls are supplied to the first and second input terminals of the first AND gate. A read signal is supplied to a gate terminal of the third transistor.

The second signal generator may include a read current source and a first write current source which are connected in parallel to a second interconnecting wire connected to the second bit line. A fourth transistor is disposed between the read current source and the second interconnecting wire. A fifth transistor is disposed between the first write current source and the second interconnecting wire. A sixth transistor is connected to the second interconnecting wire and one end of which is grounded. A third AND gate has an output terminal connected to the sixth transistor, and first and second input terminals. A fourth AND gate has an output terminal connected to the fifth transistor, and first and second input terminals being respectively connected to the first and second input terminals of the third AND gate. A second inverter is disposed between the second input terminals of the third and fourth AND gates. Write signals are supplied to the first and second input terminals of the third AND gate and a read signal is supplied to a gate terminal of the fourth transistor.

The third signal generator may include a second write current source connected to a third interconnecting wire that is connected to the third bit line. A seventh transistor is disposed between the second write current source and the third interconnecting wire. An eighth transistor is connected to the third interconnecting wire and one end of which is grounded. A fifth AND gate has an output terminal connected to the seventh transistor, and first and second input terminals. A sixth AND gate has an output terminal connected to the eighth transistor and first and second input terminals being respectively connected to the first and second input terminals of the fifth AND gate. A third inverter is disposed between the first input terminals of the fifth and sixth AND gates, where write signals are supplied to the first and second input terminals of the fifth AND gate.

The fourth signal generator may include a second moving-current source connected to a fourth interconnecting wire that is connected to the fourth bit line. A ninth transistor is disposed between the second moving-current source and the fourth interconnecting wire. A tenth transistor is connected to the fourth interconnecting wire and one end of which is grounded. A seventh AND gate has an output terminal connected to the ninth transistor, and first and second input terminals. An eighth AND gate has an output terminal connected to the tenth transistor, and first and second input terminals being respectively connected to the first and second input terminals of the seventh AND gate. A fourth inverter is disposed between the first input terminals of the seventh and eighth AND gates, where moving signals for moving the magnetic domain walls are supplied to the first and second input terminals of the seventh AND gate.

The first circuit may include a first OR gate, an output terminal of which is connected to the first word line. A second OR gate includes an output terminal connected to the second word line. A moving signal and a read signal are respectively supplied to first and second input terminals of the first OR gate, and a write signal and the read signal are respectively supplied to first and second input terminals of the second OR gate.

The magnetic track, the first and second word lines, the first through fourth bit lines and the first to third switching devices may form one unit memory region together, and a plurality of unit memory regions may form a memory array together.

A first decoder may be disposed between the first circuit and the memory array, and a second decoder may be disposed between the second circuit and the memory array.

The write/read unit may be a tunnel magneto resistance (TMR) device or a giant magneto resistance (GMR) device.

The write/read unit may be disposed at a center part of the magnetic track.

The gates of the first to third switching devices may be respectively connected to different word lines.

One or more embodiments may include a method of operating an information storage device including a magnetic track including a plurality of magnetic domain regions and magnetic domain wall regions between adjacent magnetic domain regions. A write/read unit is included on a first region of the magnetic track, where first and second electrodes are disposed at both ends of the write/read unit. First and second switching devices are respectively connected to both ends of the magnetic track. A third switching device is connected to the first electrode of the write/read unit and a circuit controlling the first to third switching devices and supplies current to at least one of the magnetic track and the write/read unit. The method includes turning on at least one of the first to third switching devices and supplying current to at least one of the magnetic track and the write/read unit.

The current may be read current, write current, or moving current for moving magnetic domain walls of the magnetic track.

The first to third switching devices may be transistors.

Gates of the first and second switching devices may be connected to a first word line, and a gate of the third switching device may be connected to a second word line.

First through fourth bit lines may intersect the first and second word lines. The first bit line may be connected to the first switching device, the second bit line may be connected to the third switching device, the third bit line may be connected to the second electrode of the write/read unit, and the fourth bit line may be connected to the second switching device.

The circuit may include a first circuit connected to the first and second word lines and a second circuit connected to the first through fourth bit lines.

The second circuit may include first through fourth signal generators being respectively connected to the first through fourth bit lines. A read operation performed on the first region including the write/read unit may be controlled by the first and second signal generators. A write operation performed on the first region under may be controlled by the second and third signal generators. Movement of magnetic domain walls in the magnetic track may be controlled by the first and fourth signal generators.

The first circuit may turn on the first to third switching devices, and the second circuit may supply read current to the first signal generator through the write/read unit from the second signal generator.

The first circuit may turn on the third switching device, and the second circuit may supply write current to one of the second and third signal generators through the write/read from the other one of the second and third signal generators.

The first circuit may turn on the first and second switching devices, and the second circuit may supply moving current to one of the first and fourth signal generators through the magnetic track from the other one of the first and fourth signal generators.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
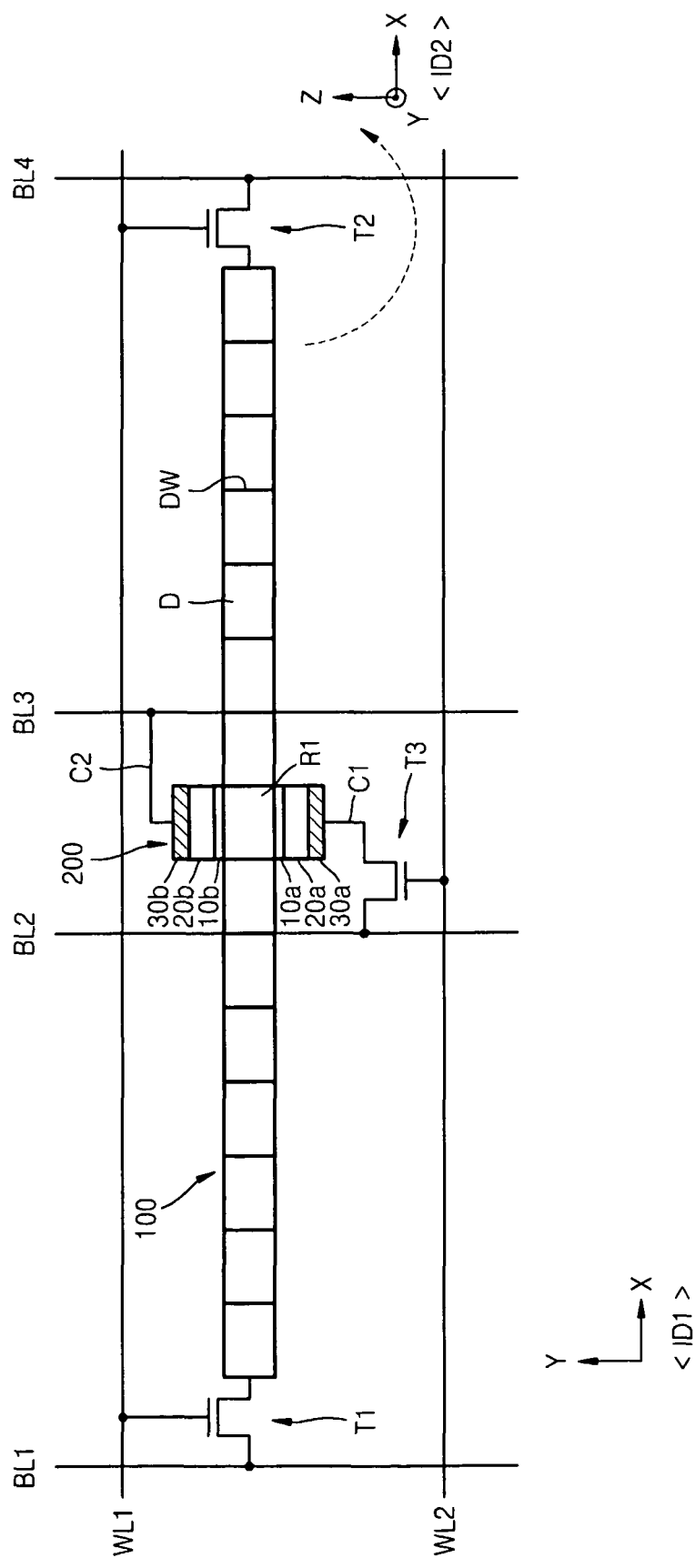
FIG. 1 illustrates a unit memory region according to an example embodiment.

Example embodiments will be more clearly understood from the detailed description taken in conjunction with the accompanying drawings.

Various example embodiments will now be described more fully with reference to the accompanying drawings in which some example embodiments of are shown. In the drawings, the thicknesses of layers and regions may be exaggerated for clarity.

Detailed illustrative embodiments are disclosed herein. However, specific structural and functional details disclosed herein are merely representative for purposes of describing example embodiments. Example embodiments may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

Now, in order to more specifically describe example embodiments, various embodiments will be described in detail with reference to the attached drawings. However, the scope should not be limited to the example embodiments, but may be embodied in various forms. In the figures, if a layer is formed on another layer or a substrate, it means that the layer is directly formed on another layer or a substrate, or that a third layer is interposed therebetween. In the following description, the same reference numerals denote the same elements.

Although the example embodiments have been disclosed for illustrative purposes, those skilled in the art will appreciate that various modifications, additions and substitutions are possible, without departing from the scope and spirit as disclosed in the accompanying claims.

FIG. 1 illustrates a unit memory region according to an example embodiment. In FIG. 1, a first direction indicator ID1 indicates directions of first and second word lines WL1 and WL2 and first through fourth bit lines BL1 to BL4, and a second direction indicator ID2 indicates directions of a magnetic track 100 and a first unit 200 (e.g., a write/read unit).

Referring to FIG. 1, the magnetic track 100 may extend in a direction, e.g., in the X-axis direction. The magnetic track 100 may include a plurality of magnetic domain regions D and magnetic domain wall regions DW between adjacent magnetic domain regions D. The magnetic track 100 may be formed of a ferromagnetic material that contains at least one of Cobalt (Co), Nickel (Ni), and Iron (Fe). The ferromagnetic material may further contain a material other than Co, Ni, and Fe.

The first unit 200 may be disposed on a region of the magnetic track 100, e.g., a center part R1 of the magnetic track 100 (hereinafter referred to as "first region R1"). The first region R1 may correspond to one of the plurality of the magnetic domain regions D. The first unit 200 may be a device for writing/reading information. For example, the first unit 200 may be a device using a tunnel magneto resistance (TMR) effect or a giant magneto resistance (GMR) device. More specifically, the first unit 200 may include a first pinned layer 20a formed on the remaining of the top and bottom surfaces, e.g., on the bottom surface, of the first region R1. The first unit 200 may further include a first separation layer 10a between the first region R1 and the first pinned layer 20a. Also, the first unit 200 may include a second pinned layer 20b on the remaining of the top and bottom surfaces, e.g., on the top surface, of the first region R1, and may further include a second separation layer 10b between the first region R1 and the second pinned layer 20b.

Directions of magnetization of the first pinned layer 20a and the second pinned layer 20b may be opposite to each other. The first and second separation layers 10a and 10b may be insulating layers or conductive layers. If the first and second separation layers 10a and 10b are insulating layers, the first unit 200 is a TMR device. If the first and second separation layers 10a and 10b are conductive layers, the first unit 200 is a GMR device. If the first and second separation layers 10a and 10b are conductive layers, a resistive layer (not shown) having higher electrical resistance than the first region R1 may be formed between the first and second separation layers 10a and 10b and the first region R1. A first electrode 30a may be formed at a bottom surface of the first pinned layer 20a, and a second electrode 30b may be formed at a top surface of the second pinned layer 20b.

In addition, a free layer (not shown) may be formed between the first pinned layer 20a and the first separation layer 10a and/or between the second pinned layer 20b and the second separation layer 10b. When a free layer is formed, another separation layer (not shown) may be included between the free layer and the corresponding first and/or second pinned layers 20a and/or 20b. The first unit 200 may be constructed in various ways. The region of the magnetic track 100 located on one side, e.g., a left side, of the first unit 200 may be an effective storage region. The other region of the magnetic track 100 located on another side, e.g., a right side, of the first unit 200 may be a temporary storage region, i.e., a buffer region.

First and second switching devices T1 and T2 may be respectively connected to both ends of the magnetic track 100. A third switching device T3 may be connected to one end, e.g., a bottom surface of the first unit 200. The first to third switching devices T1 to T3 may be transistors. In this case, a first word line WL1 may be commonly connected to gates of the first and second switching devices T1 and T2, and a second word line WL2 may be separated from the first word line WL1 and be connected to a gate of the third switching device T3. The first and second word lines WL1 and WL2 may be parallel to the magnetic track 100.

First through fourth bit lines BL1 to BL4 may intersect the first and second word lines WL1 and WL2, for example, in the vertical direction. The first bit line BL1 may be connected to the first switching device T1 and the second bit line BL2 may be connected to the third switching device T3. The third bit line BL3 may be connected to another end, e.g., a top surface, of the first unit 200 through a second conducting wire C2. The fourth bit line BL4 may be connected to the second switching device T2. In other words, the first switching device T1 may be disposed at a location where the first word line WL1 and the first bit line BL1 intersect each other, the second switching device T2 may be disposed at a location where the first word line WL1 and the fourth bit line BL4 intersect each other, and the third switching device T3 may be disposed at a location where the second word line WL2 and the second bit line BL2 intersect each other. An end, i.e., the first electrode 30a, of the first unit 200 and the third switching device T3 may be connected via a first conducting wire C1, and the other end, i.e., the second electrode 30b, of the first unit 200 and the third bit line BL3 may be connected via the second conducting wire C2. The first electrode 30a may be considered as a part of the first unit 200 or a part of the first conducting wire C1. Similarly, the second electrode 30b may be considered as a part of the first unit 200 or a part of the second conducting wire C2.

In FIG. 1, the first to third switching devices T1 to T3 may be switching devices, e.g., diodes, other than transistors. Furthermore, at least one of the first and second switching devices T1 and T2 may be omitted, and the location of the third switching device T3 may be changed. For example, the third switching device T3 may be disposed at a location where the second word line WL2 and the third bit line BL3 intersect each other.

Figure 2:
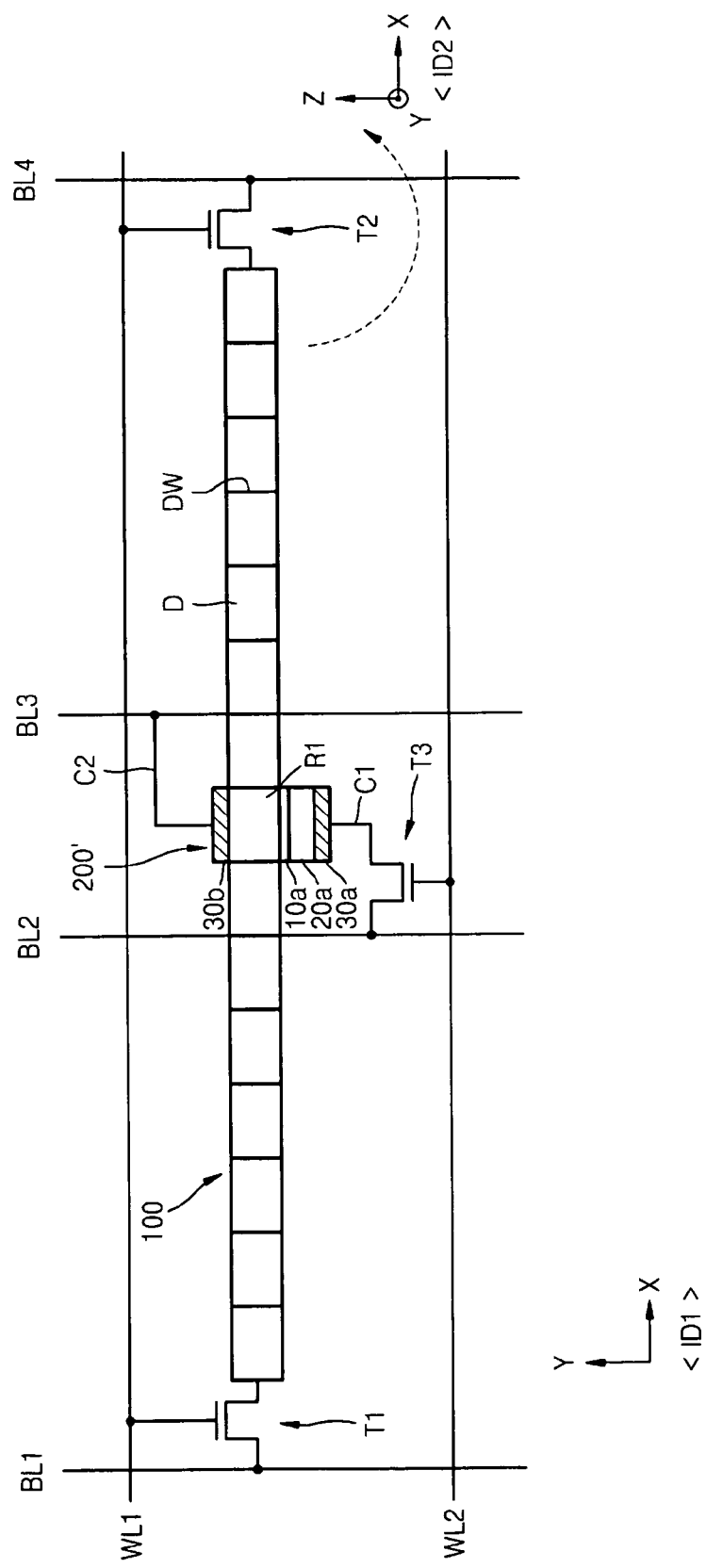
FIG. 2 illustrates a unit memory region according to another example embodiment.

Although FIG. 1 illustrates that the first unit 200 includes the first and second pinned layers 20a and 20b, the first unit 200 may include only one pinned layer as illustrated in FIG. 2.

Referring to FIG. 2, a first unit 200' may include a first pinned layer 20a formed on one of top and bottom surfaces, e.g., the bottom surface, of a first region R1, and a first separation layer 10a formed between the first pinned layer 20a and the first region R1. A first electrode 30a may be formed on a bottom surface of the first pinned layer 20a, and a second electrode 30b may be formed on a top surface of the first region R1. A resistive layer (not shown) having higher electrical resistance than the magnetic track 100 may be formed between the first region R1 and the second electrode 30b. If the first separation layer 10a is a conductive layer, such a resistive layer may be formed between the first region R1 and the first separation layer 10a.

Figure 3A:
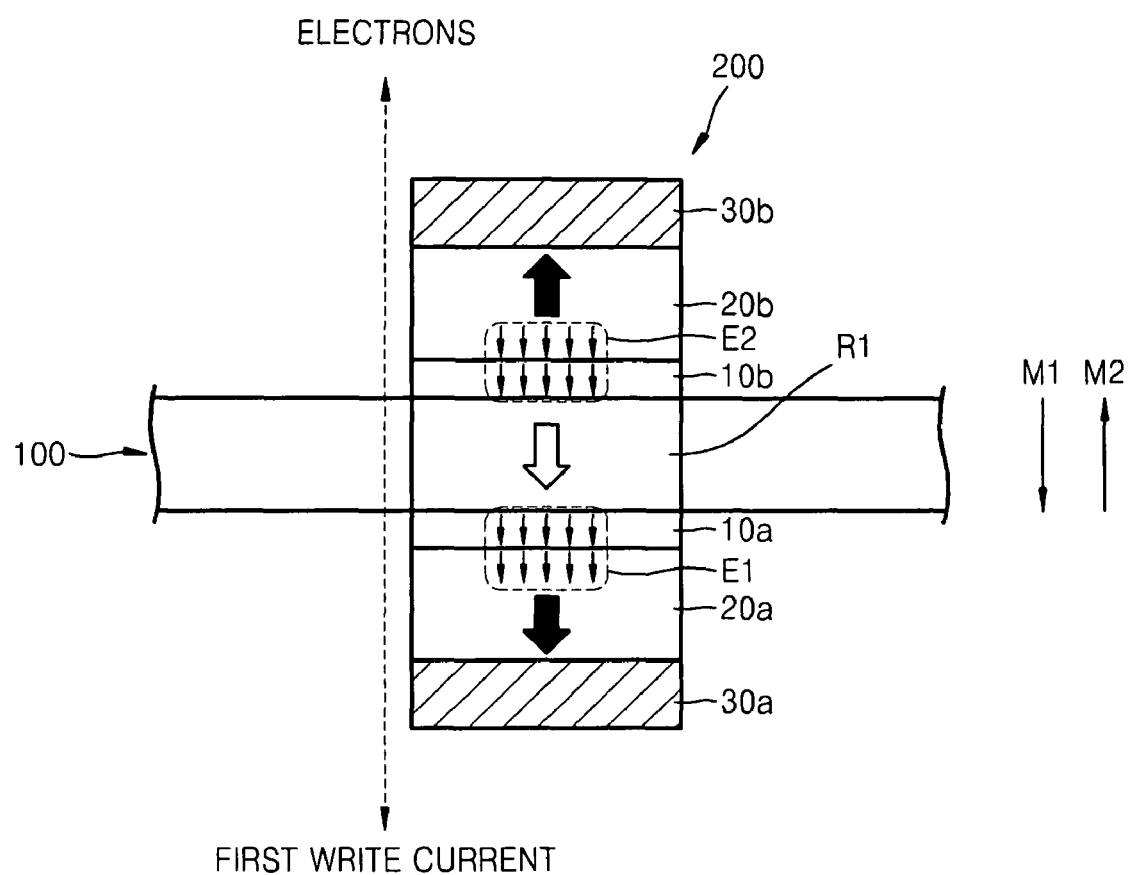
FIGS. 3A and 3B are cross-sectional views illustrating an example embodiment of a method of writing information using a first unit of FIG. 1.
Figure 3B:
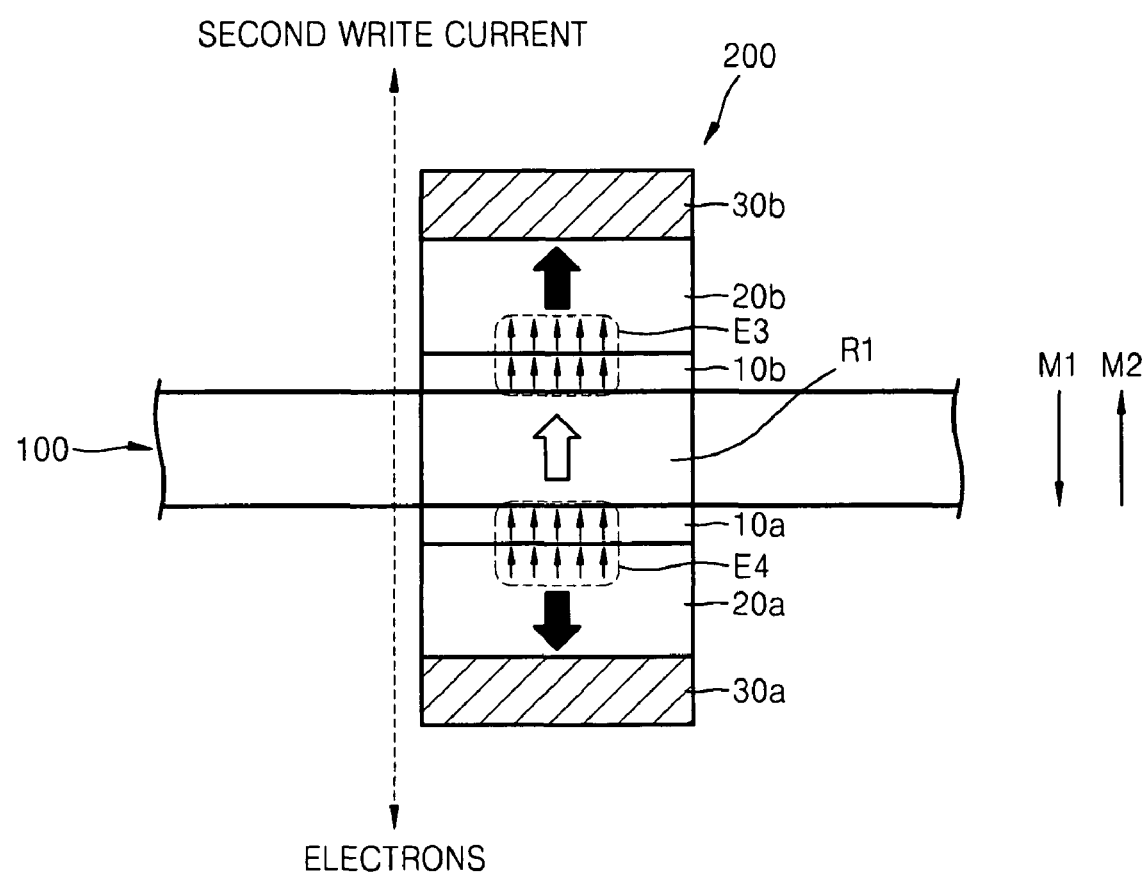

An example method of writing information by using the first unit 200 of FIG. 1 will now be described in detail with reference to FIGS. 3A and 3B. FIGS. 3A and 3B are partial cross-sectional views of the unit memory region of FIG. 1. In FIGS. 3A and 3B, the first and second pinned layers 20a and 20b and the magnetic track 100 may have vertical magnetic anisotropy, and the first and second pinned layers 20a and 20b may be respectively magnetized, for example, in a first direction M1 and a second direction M2, and vice versa. Also, the first and second pinned layers 20a and 20b and the magnetic track 100 may have horizontal magnetic anisotropy.

Referring to FIG. 3A, when electrons move from the first electrode 30a to the second electrode 30b by supplying a first write current from the second electrode 30b to the first electrode 30a, electrons E1 that are magnetized in a direction identical to the direction (first direction M1) of magnetization of the first pinned layer 20a move from the first electrode 30a to the first region R1. The movement of the electrons E1 allows the first region R1 to be magnetized in the first direction M1. In the second pinned layer 20b, electrons that are magnetized in a direction identical to the direction (second direction M2) of magnetization of the second pinned layer 20b, are discharged to the second electrode 30b via the second pinned layer 20b. However, electrons E2 that are magnetized in a direction opposite to the direction of magnetization of the second pinned layer 20b, cannot be discharged to the second electrode 30b via the second pinned layer 20b, and instead return back to and are accumulated in the first region R1. The movement of the electrons E2 allows the first region R1 to be magnetized in the first direction M1.

As described above, the first region R1 may be magnetized in the first direction M1 by spin transfer torque applied from the first pinned layer 20a and the second pinned layer 20b to the first region R1. If the first region R1 has been magnetized in the second direction M2 before the first write current is applied, a direction of magnetization of the first region R1 may change from the second direction M2 to the first direction M1 by applying the first write current.

Referring to FIG. 3B, if electrons move from the second electrode 30b to the first electrode 30a by applying a second write current from the first electrode 30a to the second electrode 30b, then electrons E3 that are magnetized in a direction identical to the direction (second direction M2) of magnetization of the second pinned layer 20b move from the second electrode 30b to the first region R1. The movement of the electrons E3 allows the first region R1 to be magnetized in the second direction M2. In the first pinned layer 20a, electrons that are magnetized in a direction identical to the direction (first direction M1) of magnetization of the first pinned layer 20a are discharged to the first electrode 30a via the first pinned layer 20a. However, electrons E4 that are magnetized in a direction opposite to the direction (second direction M2) of magnetization of the first pinned layer 20a, are not discharged to the first electrode 30a via the first pinned layer 20a and instead are accumulated in the first region R1. The movement of the electrons E4 allows the first region R1 to be magnetized in the second direction M2. If the first region R1 has been magnetized in the first direction M1 before the second write current is applied, the direction of magnetization of the first region R1 may change from the first direction M1 to the second direction M2 by applying the second write current.

Before the operation in FIG. 3A or after the operation in FIG. 3B, magnetic domains and magnetic domain walls may be moved by one bit within the magnetic track 100 in a direction by applying a current to the magnetic track 100. A large amount of information may be written to the magnetic track 100 by magnetizing a magnetic domain located on the first region R1 in a direction as described above with reference to FIGS. 3A and 3B while moving the magnetic domains and the magnetic domain walls within the magnetic track 100 in the units of bits.

As described above, the first pinned layer 20a and the second pinned layer 20b, the directions of magnetization of which are opposite to each other, are respectively formed on bottom and top surfaces of the magnetic track 100. Thus, information may be written by spin transfer torque induced by both the first and second pinned layers 20a and 20b.

A writing method performed by the unit memory region of FIG. 2 is substantially similar to that performed by the unit memory region of FIG. 1. However, the unit memory region of FIG. 2 uses the first unit 200' including one pinned layer (the first pinned layer 20a), and thus, information is written by spin transfer torque applied from only the first pinned layer 20a to the first region R1.

Reading may also be performed using the first unit 200 of FIG. 1 (or the first unit 200' of FIG. 2). The type of information written to the first region R1 may be determined by supplying read current to the first unit 200 or 200'. The read current may be supplied between one of the first electrode 30a and the second electrode 30b (or the first electrode 30a of the first unit 200' of FIG. 2), and one of both ends of the magnetic track 100. The amount of the read current may vary according to the information written to the first region R1. The read current may not be greatly influenced by the state of magnetization of the other magnetic domain regions D except for the first region R1. That is, the state of magnetization of the first region R1 may be a factor that determines the amount of the read current. Thus, the type of the information written to the first region R1 may be determined by supplying the read current. A large amount of information written to the magnetic track 100 may be reproduced by reading the information located in the first region R1 while moving the magnetic domains and the magnetic domain walls by one bit.

A method of operating a unit memory region, such as that shown in FIG. 1, will now be described in greater detail with reference to FIGS. 4 to 6.

<Write Operation>

Figure 4:
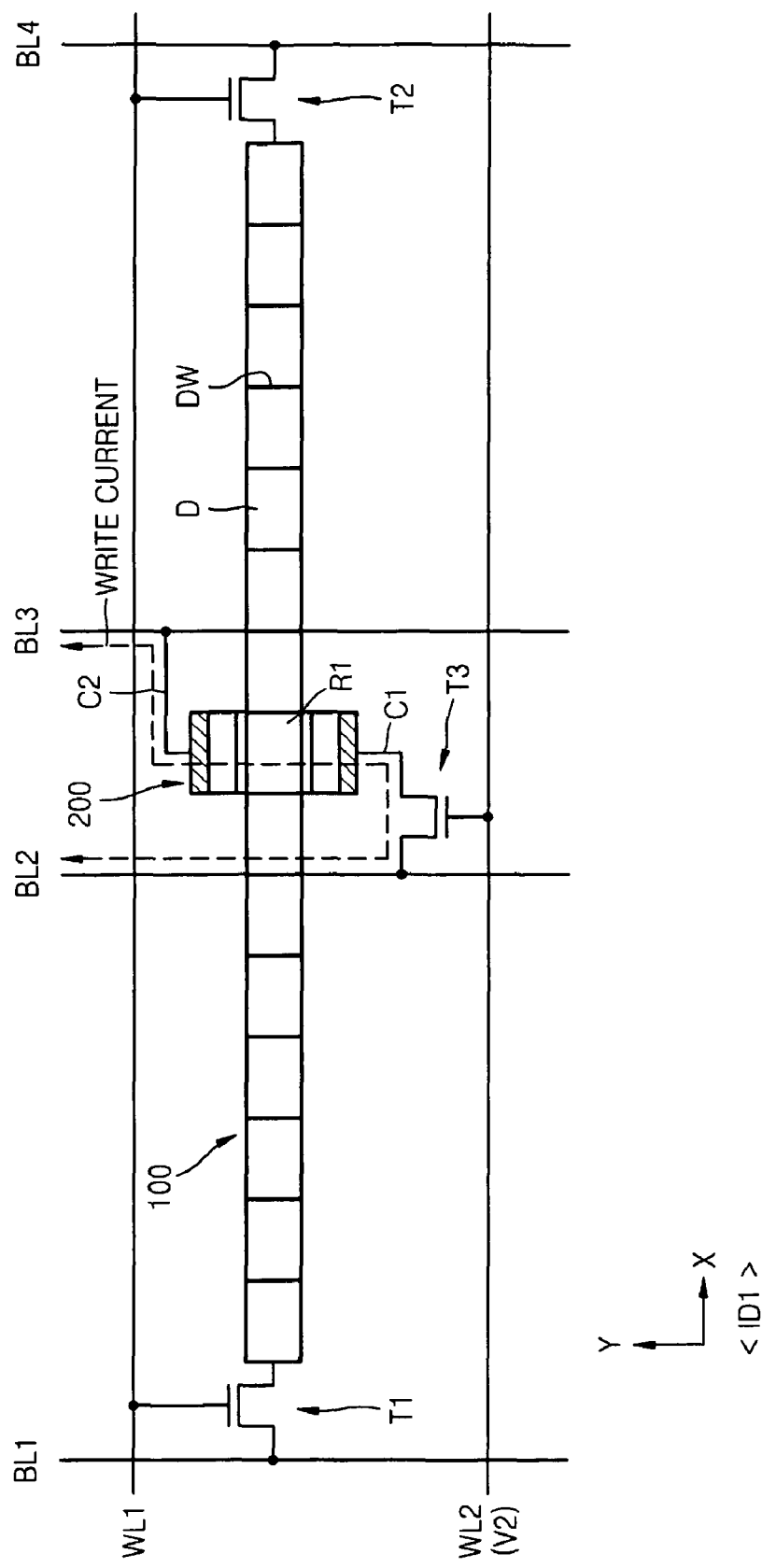
FIGS. 4 to 6 are circuit diagrams illustrating an example embodiment of a method of operating the unit memory region of FIG. 1.

Referring to FIG. 4, while the third switching device T3 is turned on by applying a voltage V2 to the second word line WL2, a write current may be supplied to the first unit 200 via the second bit line BL2 and the third bit line BL3. The type of information that is to be written to the first region R1 may be determined by a direction of the write current.

Figure 5:
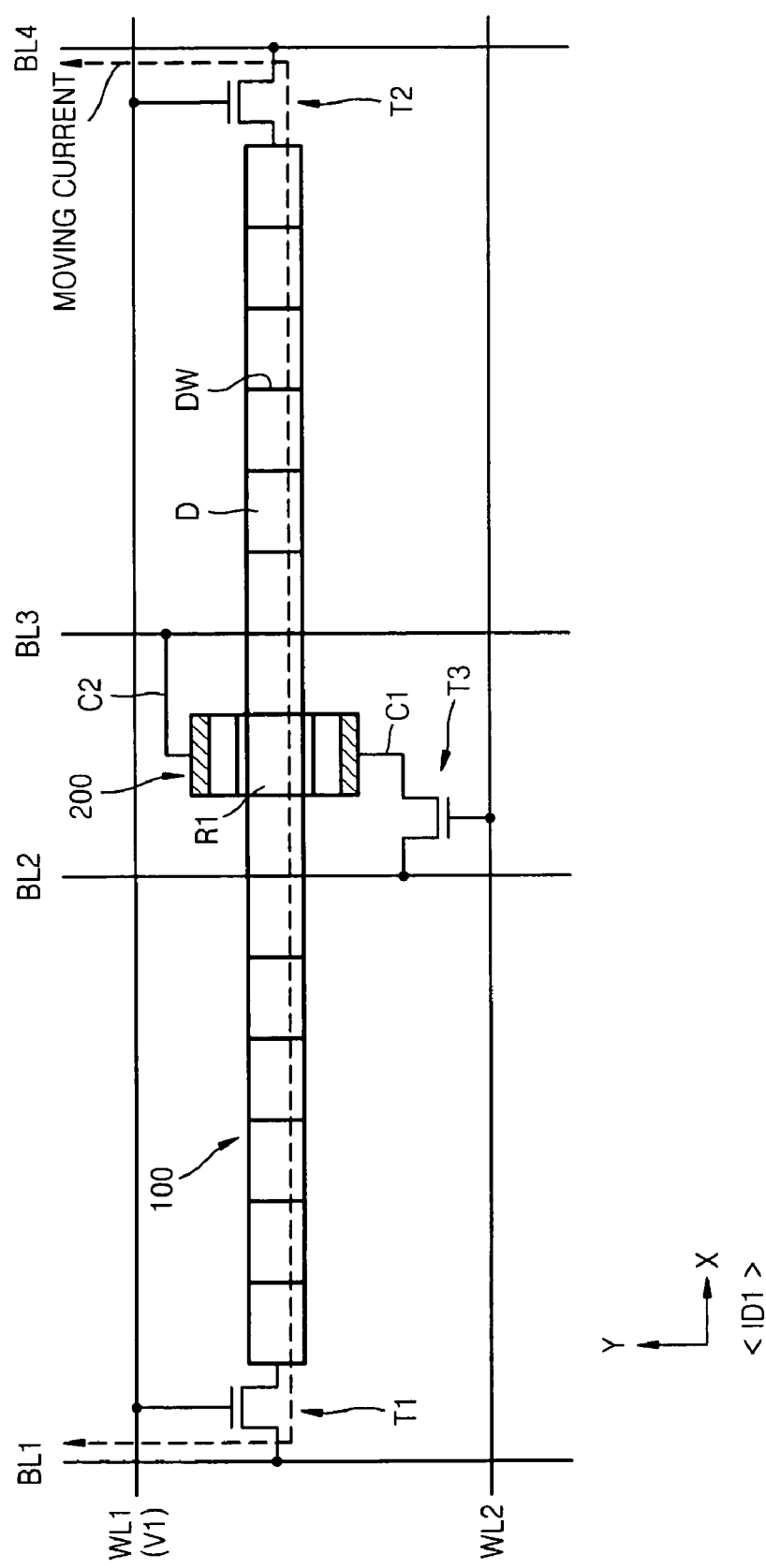

Referring to FIG. 5, while the first and second switching devices T1 and T2 are turned on by applying a voltage V1 to the first word line WL1, a moving current (e.g., a pulse current) may be supplied to a magnetic track 100 via the first bit line BL1 and the fourth bit line BL4. A direction in which magnetic domains and magnetic domain walls are moved within the magnetic track 100 may vary according to the direction of the moving current. Since current is conventionally regarded as flowing in a direction opposite to that in which electrons move, the magnetic domains an the magnetic domain walls may be moved in an opposite direction to that in which the moving current flows.

By repeatedly and/or alternately performing the operations described above with reference to FIGS. 4 and 5, information may be recorded on magnetic domain regions D, which are located to one side of the first unit 200 (e.g., in the left direction), while moving the first unit 200 in the opposite direction (e.g., in the right direction).

<Read Operation>

Figure 6:
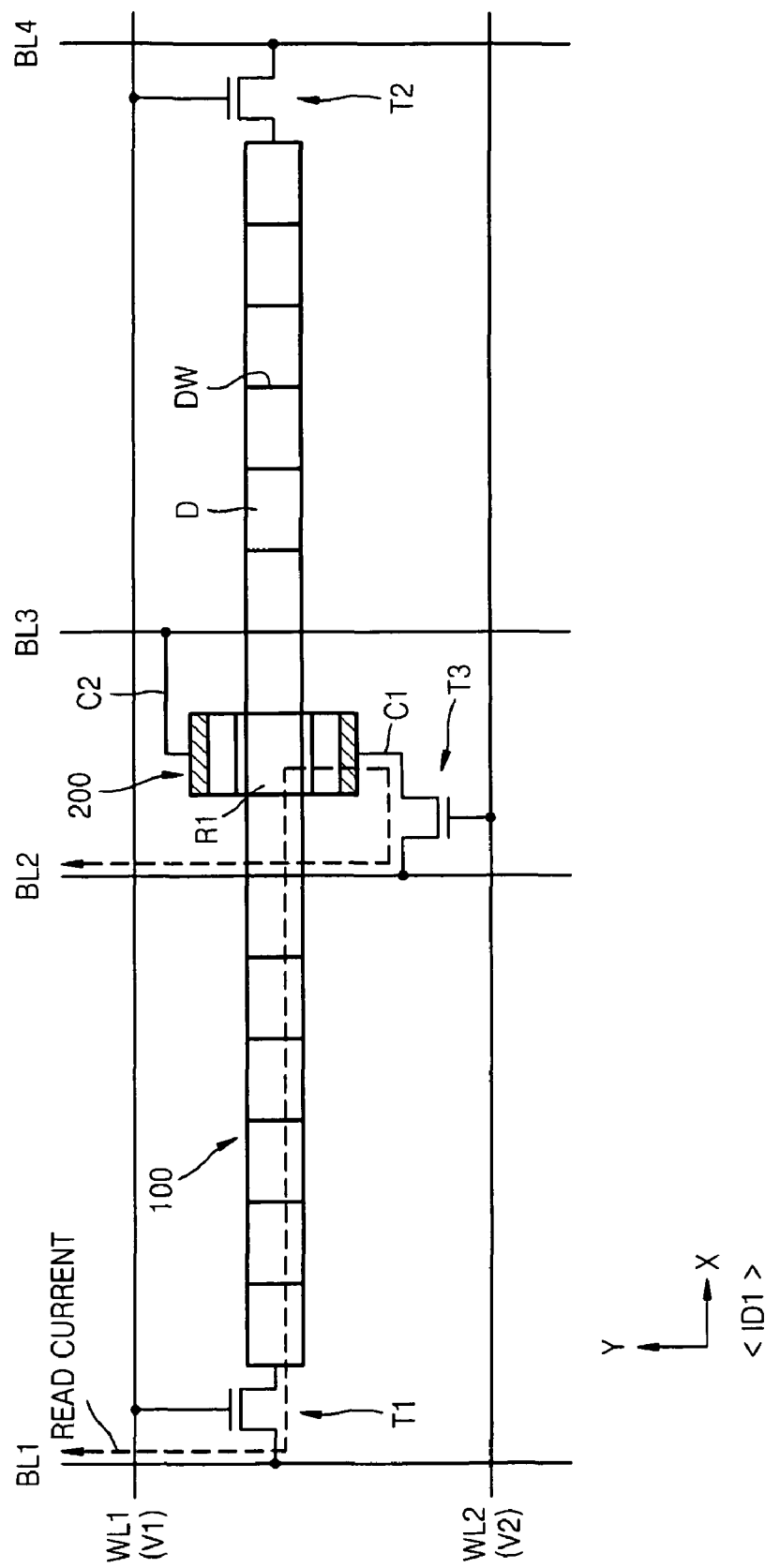

Referring to FIG. 6, while the first to third switching devices T1 to T3 are turned on by applying voltages V1 and V2 to the first and second word lines WL1 and WL2, a read current may be supplied between the first bit line BL1 and the second bit line BL2. The read current may flow via a part of the first unit 200 (a lower portion of the first region R1) and the first region R1. The amount of the read current may be influenced by a direction of magnetization of the first region R1. That is, an electrical resistance between the first bit line BL1 and the second bit line BL2 may change according to the direction of magnetization of the first region R1. Thus, the type of information written to the first region R1 may be determined by applying the read current. The amount of the read current is less than that of the above write current and thus, does not change the direction of magnetization of the first region R1.

Reading may be performed by supplying a read current between the second bit line BL2 and a fourth bit line BL4 rather than by supplying the read current to the first bit line BL1 and the second bit line BL2. Also, if the third switching device T3 is disposed at a location where the second word line WL2 intersects the third bit line BL3 rather than the second bit line BL2, reading may be performed by supplying the read current between the third bit line BL3 and the first bit line BL1 or between the third bit line BL3 and the fourth bit line BL4. Accordingly, information may be read from the first region R1 by supplying the read current between one of both ends of the first unit 200 and one of both ends of the magnetic track 100. As described above, the first unit 200 may be used as a device for reading information. Thus, the first unit 200 may be referred to as a writing/reading unit capable of performing both a write operation and a read operation. However, it should be understood that the first unit 200 may be used as only a writing unit and a reading unit may be separately installed.

The read operation of FIG. 6 and the method of FIG. 5 of moving magnetic domains and magnetic domain walls by a unit bit may be repeatedly and alternately performed. In this way, it is possible to read information from magnetic domain regions D located at one side of the first unit 200 (e.g., in the left direction) by moving the first unit 200 in the opposite direction (e.g., in the right direction).

A write operation and a read operation performed by the unit memory region of FIG. 2 may be similar to the write and read operations described above with reference to FIGS. 4 to 6.

An example embodiment of an information storage device may include a plurality of the unit memory regions of FIG. 1 or 2.

Figure 7:
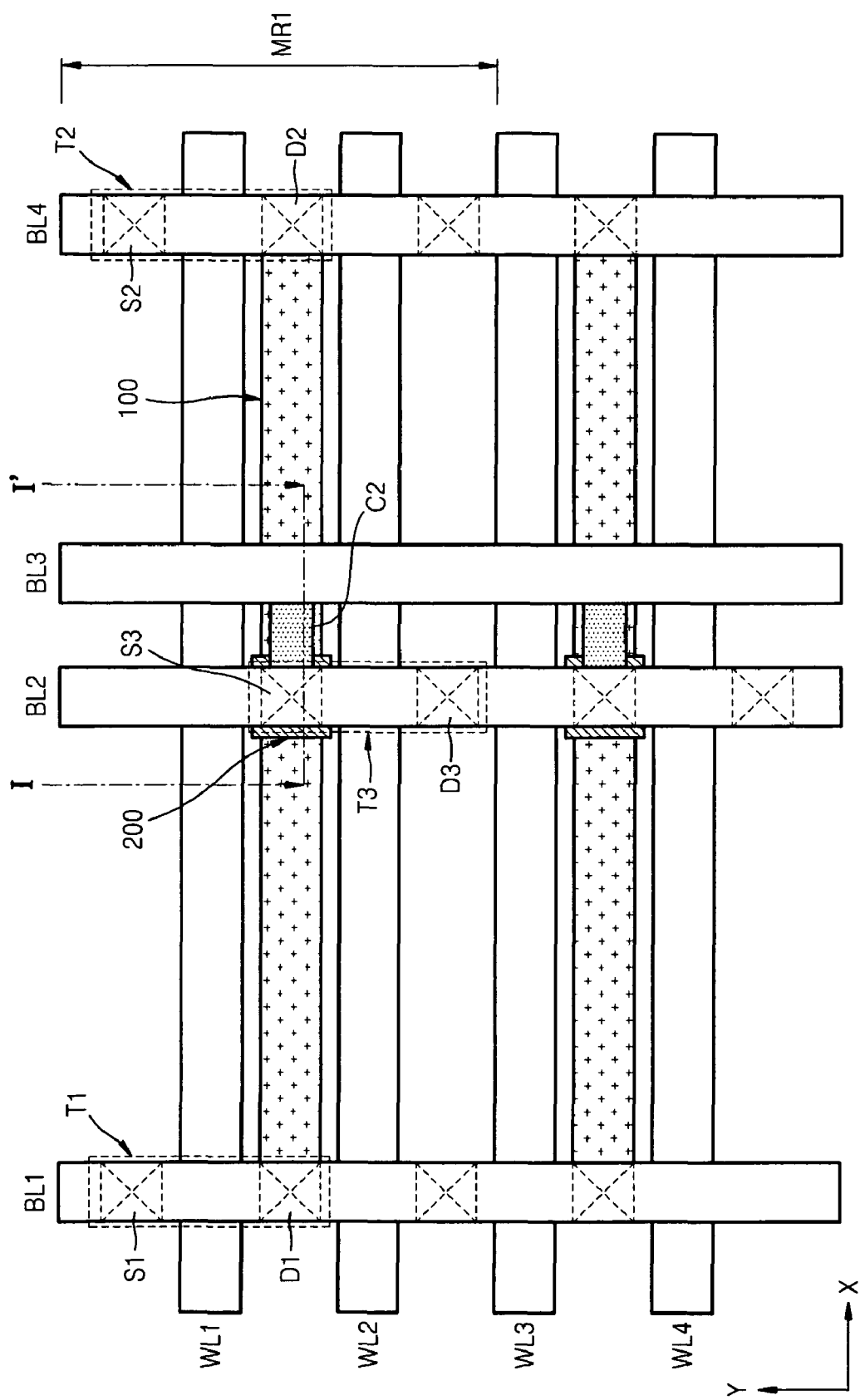
FIG. 7 is a layout diagram of an example embodiment of an information storage device.

FIG. 7 is a layout diagram of an example embodiment of an information storage device. Referring to FIG. 7, the information storage device may include first through fourth word lines WL1 to WL4, and first through fourth bit lines BL1 to BL4 that intersect the first through fourth word lines WL1 to WL4. The first switching device T1 may be disposed at a location where the first word line WL1 intersects the first bit line BL1, and the second switching device T2 may be disposed at a location where the first word line WL1 intersects the fourth bit line BL4. The first switching device T1 may include a first source S1 and a first drain D1 which are disposed on both sides of the first word line WL1. The second switching device T2 may include a second source S2 and a second drain D2 which are disposed on the both sides of the first word line WL1.

The magnetic track 100 whose first and second ends are respectively connected to the first and second switching devices T1 and T2, may be disposed between the first and second word lines WL1 and WL2. The first source S1 and the first drain D1 of the first switching device T1 may be connected to the first bit line BL1 and the first end of the magnetic track 100 respectively. The second source S2 and the second drain D2 of the second switching device T2 may be connected to the fourth bit line BL4 and the second end of the magnetic track 100, respectively.

The first unit 200 may be disposed on a region, e.g., a center region, of the magnetic track 100. The second bit line BL2 may be disposed above the first unit 200. The third bit line BL3 may be apart a distance from the second bit line BL2. A top surface of the first unit 200 may be electrically connected to the third bit line BL3 via a second conducting wire C2. A connection between the top surface of the first unit 200 and the third bit line BL3, and a connection between a bottom surface of first unit 200 and a third source S3 will be described later with reference to FIG. 8.

The third switching device T3 may be disposed at a location where the second word line WL2 intersects the second bit line BL2. The third switching device T3 includes a third source S3 and a third drain D3 disposed on both sides of the second word line WL2. The third source S3 may be electrically connected to the bottom surface of the first unit 200, and the third drain D3 may be electrically connected to the second bit line BL2. In the first to third switching devices T1 to T3, it should be understood that the functions of the first to third sources S1 to S3 may be switched with those of the first to third drains D1 to D3.

The unit memory region MR1 of FIG. 7 may correspond to the unit memory region of FIG. 1. Although FIG. 7 illustrates that a plurality of the unit memory regions MR1 are arranged in the Y-axis direction, a plurality of the unit memory region MR1 may be arranged in a matrix in the X-axis, or the X-axis and Y-axis directions.

Figure 8:
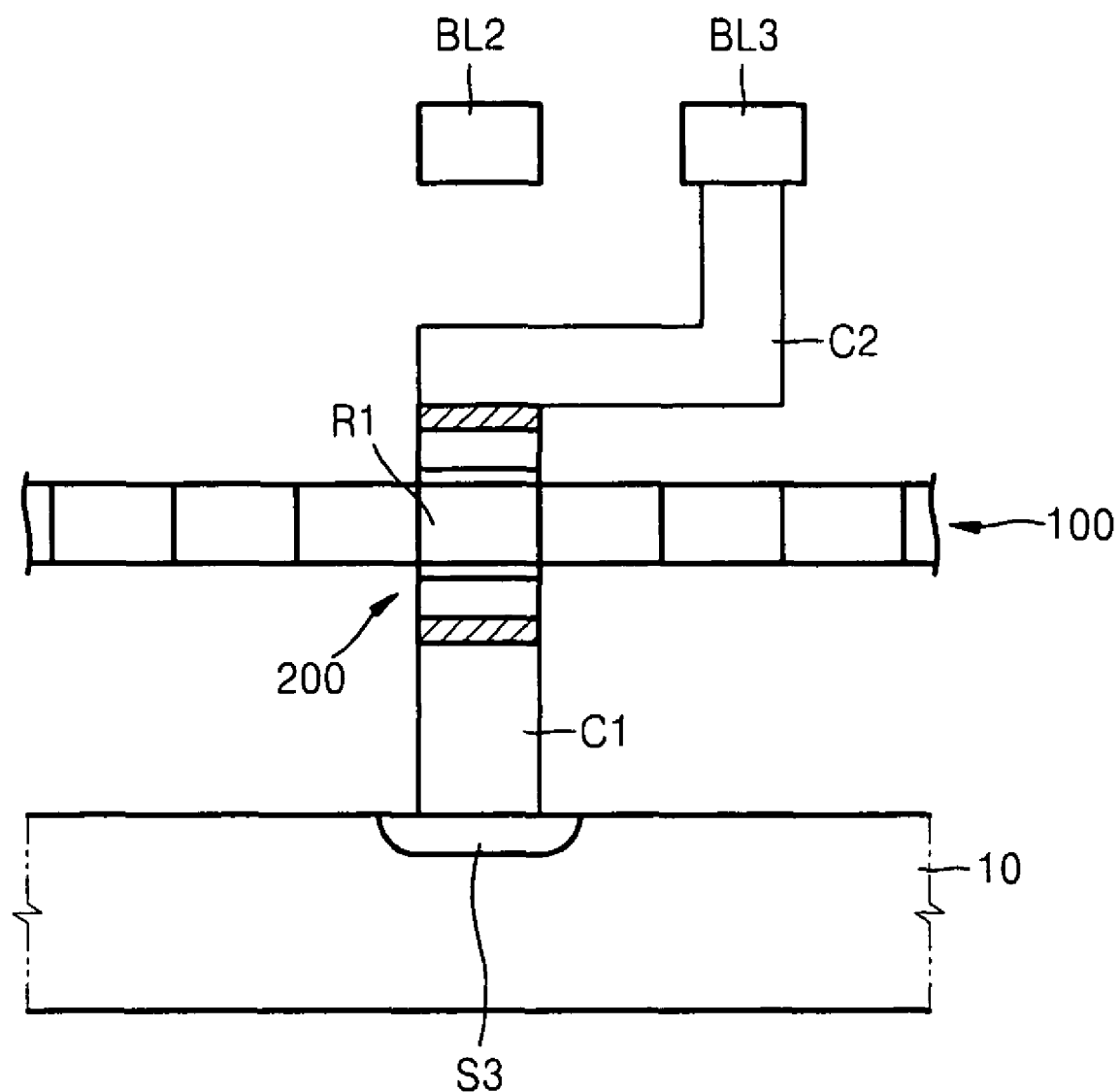
FIG. 8 is a cross-sectional view taken along the line I-I' of FIG. 7.

FIG. 8 is a cross-sectional view taken along the line I-I' of FIG. 7. Referring to FIG. 8, a bottom surface of the first unit 200 may be connected to the third source S3 via a first conducting wire C1, and a top surface of the first unit 200 is connected to the third bit line BL3 via a second conducting wire C2.

However, the structures of the information storage device illustrated in FIGS. 7 and 8 are just illustrative examples. That is, the layout of the information storage device in FIG. 7 may be changed in various ways, and the structure illustrated in FIG. 8 also be changed.

Figure 9:
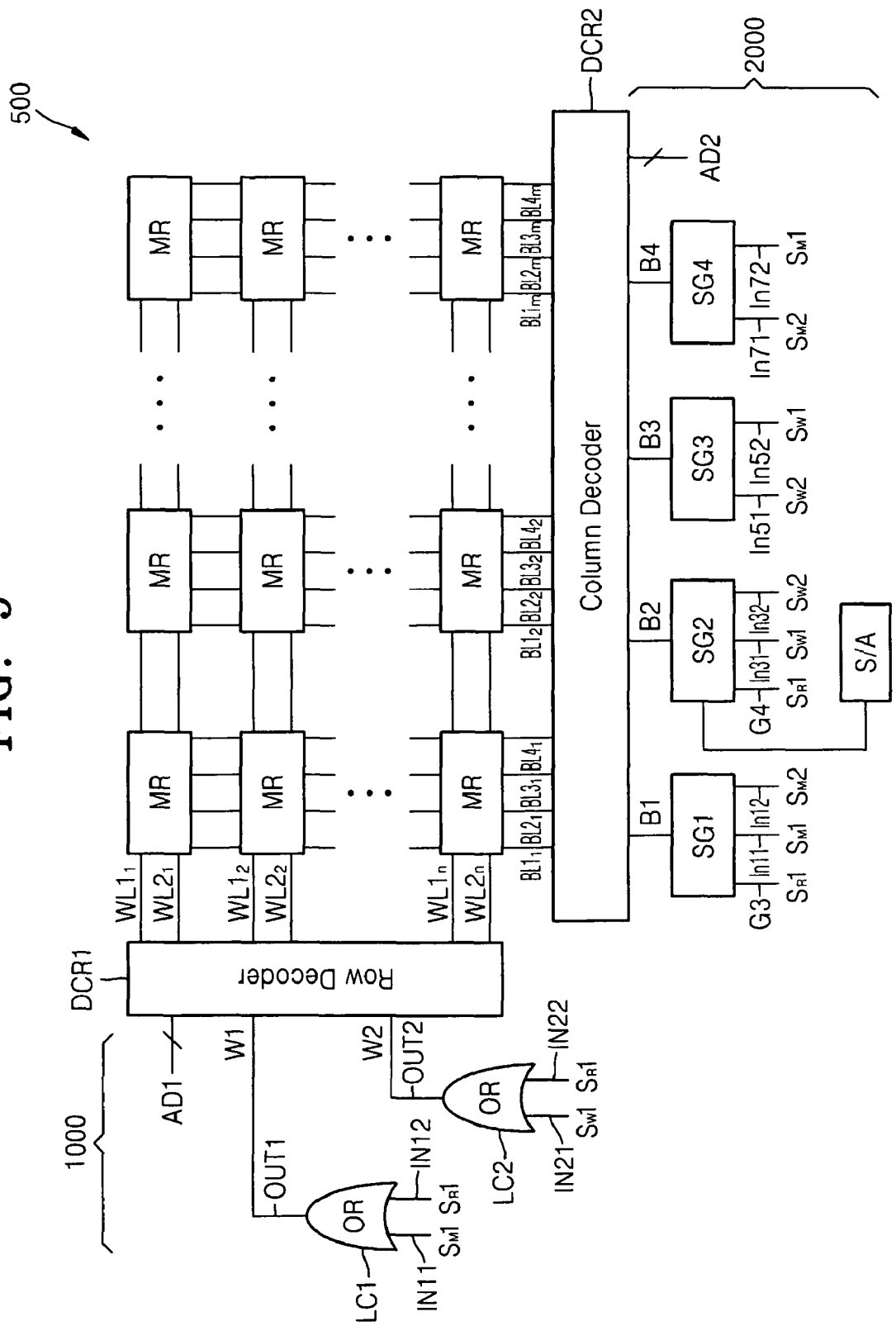
FIG. 9 illustrates an example embodiment of an information storage device.

FIG. 9 illustrates an information storage device according to an example embodiment. Referring to FIG. 9, an information storage device 500 includes a plurality of unit memory regions MR arranged in a matrix with n rows and m columns. Although FIG. 9 illustrates the unit memory regions MR in a simplified manner, the unit memory regions MR are be constructed as the memory region illustrated in either FIG. 1 or FIG. 2. Here, reference numerals $WL1_j$ and $WL2_j$ respectively denote a first word line and a second word line that are commonly connected to unit memory regions MR in an ith row (i is a natural number, and $1 \leq i \leq n$). Reference numerals $BL1_j$, $BL2_j$, $BL3_j$ and $BL4_j$ respectively denote first through forth bit lines that are connected to unit memory regions MR in a jth column (j is a natural number, and $1 \leq j \leq m$). The first and second word line $WL1_i$ to $WL2_i$ may respectively correspond to the first and second word lines WL1 to WL2 of FIG. 1 or 2, and the first to fourth bit lines $BL1_j$ to $BL4_j$ may respectively correspond to the first to fourth bit lines BL1 to BL4 of FIG. 1 or 2.

A row decoder DCR1 may be connected to the first and second word lines $WL1_1$ to $WL1_n$ and $WL2_1$ to $WL2_n$, and a column decoder DCR2 may be connected to the first to fourth bit lines $BL1_1$ to $BL1_m$, $BL2_1$ to $BL2_m$, $BL3_1$ to $BL3_m$, and $BL4_1$ to $BL4_m$. One unit memory region MR that is to operate may be selected from among the unit memory regions MR using the row decoder DCR1 and the column decoder DCR2. It is understood by those of ordinary skill in the art that the row decoder DCR1 and the column decoder DCR2 may include a selection logic device having a MUX (multiplexer) or DMUX (demultiplexer) structure, and thus, a detailed description of the row decoder DCR1 and the column decoder DCR2 will not be provided.

A first peripheral circuit 1000 may be installed adjacent to one side of the row decoder DCR1 while being connected to the row decoder DCR1. The first peripheral circuit 1000 may include at least two logic units, e.g., first and second logic elements LC1 and LC2. For example, the first and second logic elements LC1 and LC2 may be OR gates. A first row wire W1 connected to an output terminal OUT1 of the first logic element LC1 and a second row wire W2 connected to an output terminal OUT2 of the second logic element LC2, may be connected to the row decoder DCR1. The first and second row wires W1 and W2 may be respectively connected to the first and second word lines $WL1_i$ and $WL2_i$ through the row decoder DCR1. Here, reference numerals IN11 and IN12 respectively denote first and second input terminals of the first logic element LC1, and reference numerals IN21 and IN22 respectively denote first and second input terminals of the second logic element LC2. The first peripheral circuit 1000 may further include a row address line AD1 connected to the row decoder DCR1. Although not shown in FIG. 9, voltage sources may be respectively connected to the first and second logic elements LC1 and LC2.

A second peripheral circuit 2000 may be installed adjacent to one side of the column decoder DCR2 while being connected to the column decoder DCR2. The second peripheral circuit 2000 may include a plurality of signal generators (first through fourth signal generators SG1 to SG4) connected to the column decoder DCR2. The first through fourth signal generators SG1 to SG4 may be devices for supplying signals to the first through fourth bit lines $BL1_j$ to $BL4_j$ of the selected unit memory region MR. The first through fourth signal generators SG1 to SG4 will be described later in detail. The first through fourth signal generator SG1 to SG4 may be respectively connected to the column decoder DCR2 via first through fourth column wires B1 to B4. The first through fourth column wires B1 to B4 may be respectively connected to the first through fourth bit lines $BL1_j$ to $BL4_j$ through the column decoder DCR2. A sense circuit S/A may be connected to the second signal generator SG2. The sense circuit S/A may be a sense amplifier that senses and amplifies a signal of information read by a unit memory region MR. The sense circuit S/A is well known in this art and thus a detailed description thereof will not be provided here. It should be understood that the sense circuit S/A may be connected to any of the signal generators SG1-SG4. The second peripheral circuit 2000 may further include a column address line AD2 connected to the column decoder DCR2.

Logic operations of the row decoder DCR1 and the column decoder DCR2 are controlled in response to signals received from the row address line AD1 and the column address line AD2, respectively. For example, the row decoder DCR1 and the column decoder DCR2 select a unit memory region MR to operate based on signals received from the row address line AD1 and the column address line AD2. After the unit memory region MR is selected, it is possible to write information to or read information from the selected unit memory region MR or to move magnetic domain walls by using one of the first and second logic elements LC1 and LC2 and at least two signal generators from among the first through fourth signal generators SG1 to SG4.

The structures of the first through fourth signal generators SG1 to SG4 of FIG. 9 and a method of operating the same will now be described in detail with reference to FIGS. 10 to 13.

Figure 10:
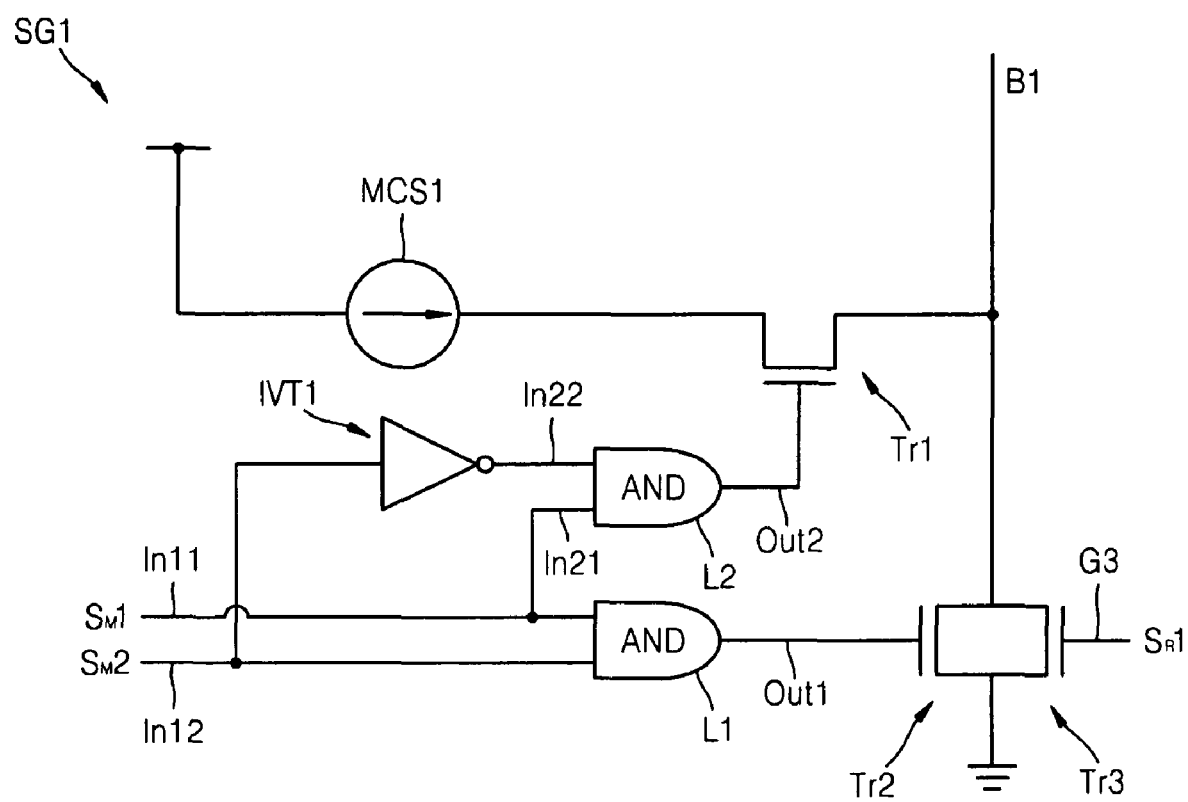
FIGS. 10 to 13 are circuit diagrams respectively illustrating an example embodiment of first to fourth signal generators of FIG. 9.

FIG. 10 is a circuit diagram of an example embodiment of the first signal generator SG1 of FIG. 9. Referring to FIG. 10, a moving-current source MCS1 may be connected to a first column wire B1 (e.g., a first interconnecting wire). A first transistor Tr1 may be connected between the first moving-current source MCS1 and the first column wire B1. A second transistor Tr2 may be connected in series to a lower part of the first column wire B1, and one end of the second transistor Tr2 may be grounded. First and second logic elements L1 and L2 that are connected to each other may be included in the first signal generator SG1. For example, the first and second logic elements L1 and L2 may be AND gates.

An output terminal Out1 of the first logic element L1 may be connected to a gate of the second transistor Tr2, and an output terminal Out2 of the second logic element L2 may be connected to a gate of the first transistor Tr1. A first input terminal In21 and a second input terminal In22 of the second logic element L2 may be respectively connected to a first input terminal In11 and a second input terminal In12 of the first logic element L1. A first inverter IVT1 for reversing a signal may be installed between the second input terminal In22 of the second logic element L2 and the second input terminal In12 of the first logic element L1.

First and second moving signals $S_M1$ and $S_M2$ may be respectively supplied to the first and second input terminals In11 and In12 of the first logic element L1. One of the first and second transistors T1 and T2 may be turned on in response to the first and second moving signals $S_M1$ and $S_M2$. If both the first and second moving signals $S_M1$ and $S_M2$ have a value of 1, the second transistor Tr2 may be turned on since information '1' is output from the first logic element L1 but the first transistor Tr1 may not be turned on since information '0' is output from the second logic element L2.

Moving current may flow from a unit memory region to the first column wire B1, the second transistor Tr2, and finally, to the ground. Thus, the magnetic domain walls of the magnetic track 100 of FIG. 1 or 2 may be moved in a first direction. If the first and second moving signals $S_M1$ and $S_M2$ respectively have values of '1' and '0', the second transistor Tr2 may not be turned on since information '0' is output from the first logic element L1, and the first transistor Tr1 may be turned on since information '1' is output from the second logic element L2.

The moving current may flow from the first moving-current source MCS1 to the first transistor Tr1, the first column wire B1, and finally, to a unit memory region. Thus, the magnetic domain walls of the magnetic track 100 may be moved in a second direction which is opposite to the first direction. The movement of the magnetic domain walls may occur in association with an operation of a fourth signal generator SG4 which will later be described.

The first signal generator SG1 may include a third transistor Tr3 which is connected to the first column wire B1 to be parallel to the second transistor Tr2. The third transistor Tr3 may share a source and a drain with the second transistor Tr2. A read signal $S_R1$ may be supplied to a gate terminal G3 of the third transistor Tr3. A read operation related to the third transistor Tr3 may be performed in association with an operation of the second signal generator SG2, which will be described below.

Figure 11:
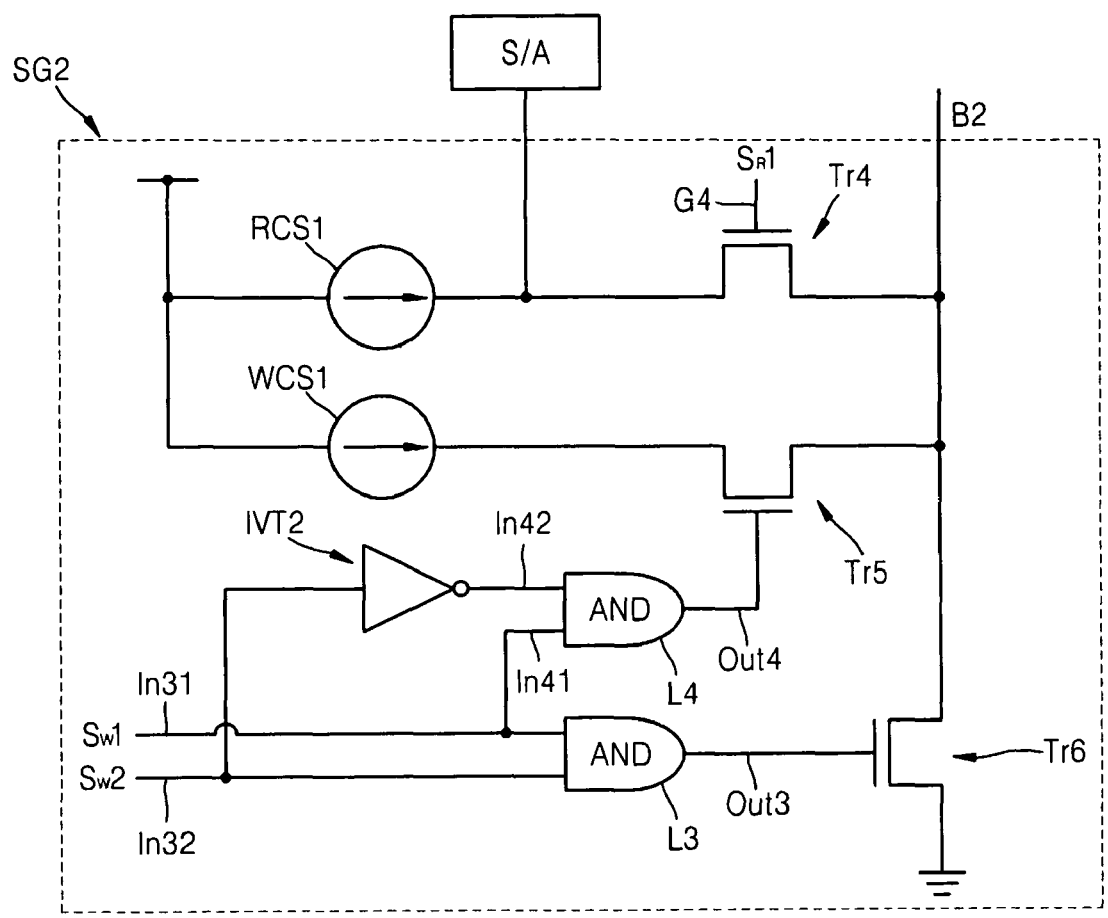

FIG. 11 is a circuit diagram of an embodiment of the second signal generator SG2 and the sense circuit S/A of FIG. 9. Referring to FIG. 11, a read current source RCS1 may be connected to a second column wire B2 (e.g., a second interconnecting wire). A fourth transistor Tr4 may be connected between the read current source RCS1 and the second column wire B2. The sense circuit S/A may be connected to a wire connecting the read current source RCS1 and the fourth transistor Tr4 (see also FIG. 9). The read signal $S_R1$ may be supplied via a gate terminal G4 of the fourth transistor Tr4. If the fourth transistor Tr4 is turned on in response to the read signal $S_R1$, read current may flow from the read current source RCS1 to a unit memory region via the second column wire B2. A signal of information read from the unit memory region may be supplied to the sense circuit S/A. Such a read operation may be performed in association with the operation of the above first signal generator SG1. That is, the read signal $S_R1$ may be supplied to the gate terminal G3 of the third transistor Tr3 of FIG. 10 simultaneously when it is supplied to the gate terminal G4 of the fourth transistor Tr4. In this way, the read current supplied to the unit memory region via the second column wire B2 of FIG. 11 may flow to the ground via the first column wire B1 of FIG. 10. Thus, a read operation may be performed on a selected unit memory region. During the read operation, a sixth transistor Tr6 of FIG. 11, which will later be described, may be turned off, and thus, the read current may not flow to the ground.

The second signal generator SG2 may include a first write current source WCS1 which is connected to the second column wire B2 to be parallel to the read current source RCS1. A fifth transistor Tr5 may be connected between the first write current source WCS1 and the second column wire B2. The sixth transistor Tr6 may be connected in series to a lower part of the second column wire B2, and one end of the sixth transistor Tr6 may be grounded. Third and fourth logic elements L3 and L4 that are connected to each other may be included in the second signal generator SG2. The constructions and connections of the third and fourth logic elements L3 and L4 and the fifth and sixth transistors Tr5 and Tr6 may be similar to those of the first and second logic elements L1 and L2 and first and second transistors Tr1 and Tr2 of FIG. 10. Reference numerals In31, In32 and Out3 respectively denote first and second input terminals and an output terminal of the third logic element L3. Reference numerals In41, In42 and Out4 respectively denote first and second input terminals and an output terminal of the fourth logic element L4. A reference numeral IVT2 denotes a second inverter that is connected between the second input terminal In32 and the second input terminal In42.

First and second write signals $S_W1$ and $S_W2$ may be supplied to the first and second input terminals In31 and In32 of the third logic element L3. One of the fifth and sixth transistors Tr5 and Tr6 may be turned on in response to the first and second write signals $S_W1$ and $S_W2$. If both the first and second write signals $S_W1$ and $S_W2$ have a value of 1, the sixth transistor Tr6 may be turned on since information '1' is output from the third logic element L3 but the fifth transistor Tr5 may not be turned on since information '0' is output from the fourth logic element L4. In this case, write current may flow from a unit memory region to the second column wire B2, the sixth transistor Tr6, and finally, to the ground. Thus, first information may be written to a first region R1, such as shown in FIG. 1 or 2, of the unit memory region. If the first and second write signals $S_W1$ and $S_W2$ respectively have values of 1 and 0, the sixth transistor Tr6 may not be turned on since information '0' is output from the third logic element L3 but the fifth transistor Tr5 may be turned on since information '1' is output from the fourth logic element L4. In this case, the write current may flow from the first write current source WCS1 to the fifth transistor Tr5, the second column wire B2, and finally, to a unit memory region. Accordingly, second information may be written to the first region R1 of the unit memory region. Such a write operation may be performed in association with an operation of the third signal generator SG3, which will be described below.

Figure 12:
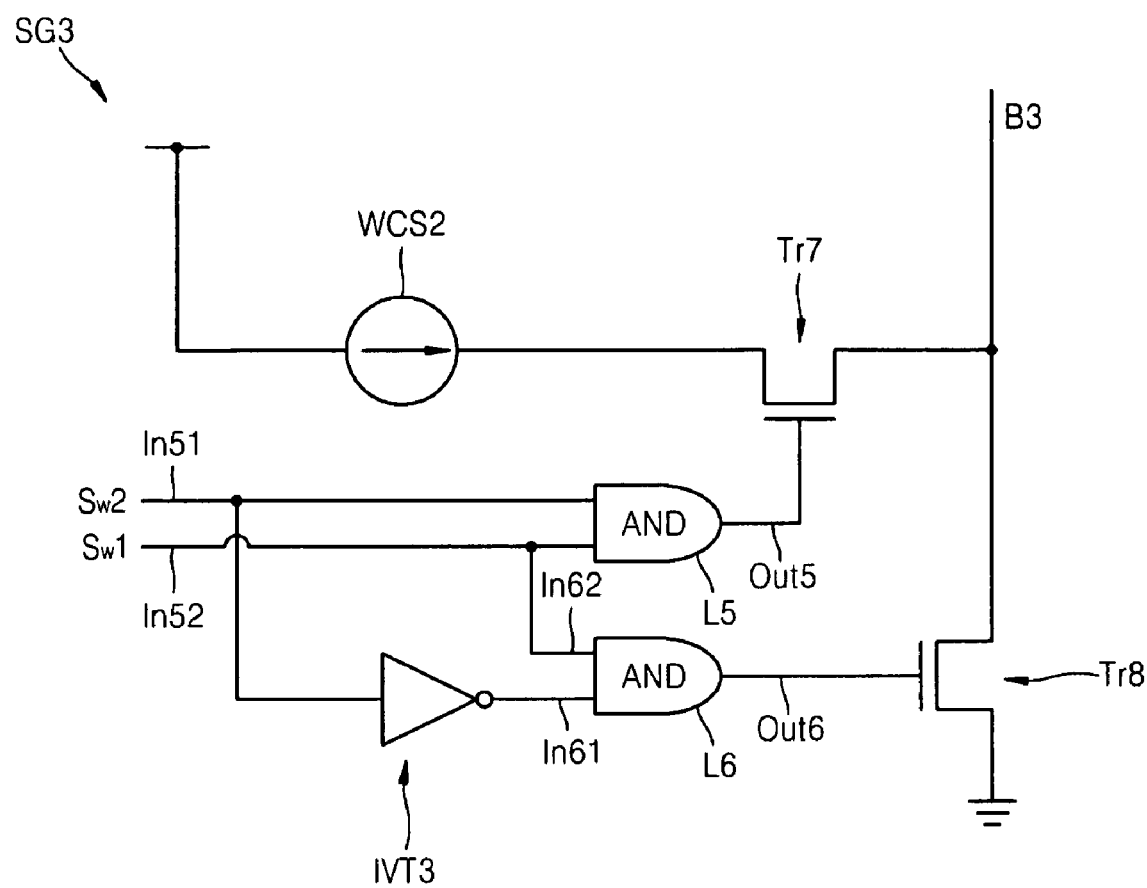

FIG. 12 is a circuit diagram of an embodiment of the third signal generator SG3 of FIG. 9. Referring to FIG. 12, a second write current source WCS2 may be connected to a third column wire B3 (e.g., a third interconnection wire). A seventh transistor Tr7 may be connected between the second write current source WCS2 and the third column wire B3. An eighth transistor Tr8 may be connected in series to a lower part of the third column wire B3. One end of the eighth transistor Tr8 may be grounded. Fifth and sixth logic elements L5 and L6 may be connected to each other. For example, the fifth and sixth logic elements L5 and L6 may be AND gates. An output terminal Out5 of the fifth logic element L5 may be connected to a gate of the seventh transistor Tr7, and an output terminal Out6 of the sixth logic element L6 may be connected to a gate of the eighth transistor Tr8. A first input terminal In61 of the sixth logic element L6 may be connected to a first input terminal In51 of the fifth logic element L5, and a second input terminal In62 of the sixth logic element L6 may be connected to a second input terminal In52 of the fifth logic element L5. A third inverter IVT3 may be connected between the first input terminal In51 of the fifth logic element L5 and the first input terminal In61 of the sixth logic element L6. The first and second write signals $S_W1$ and $S_W2$ may be supplied to the second and first input terminals In52 and In51 of the fifth logic element L5. Referring to FIG. 12, if both the first and second write signals $S_W1$ and $S_W2$ have a value of 1, the seventh transistor Tr7 may be turned on, the eighth transistor Tr8 may not be turned on, and then, the write current may flow from the second write current source WCS2 to the seventh transistor Tr7, the third column wire B3, and finally, to a unit memory region. If the first write signal $S_W1$ has a value of 1 and the second write signal $S_W2$ has a value of 0, the seventh transistor Tr7 may not be turned on, the eighth transistor Tr8 may be turned on, and then, the write current may flow from the unit memory region to the third column wire B3, the eighth transistor Tr8, and finally, to the ground.

During a write operation, the first and second write signals $S_W1$ and $S_W2$ may be supplied to the third signal generator SG3 of FIG. 12 simultaneously with being supplied to the second signal generator SG2 of FIG. 11. In this case, if both the first and second write signals $S_W1$ and $S_W2$ have a value of 1, the seventh transistor Tr7 of FIG. 12 may be turned on, the sixth transistor Tr6 of FIG. 11 may be turned on, and then, the write current may flow from the second write current source WCS2 to the seventh transistor Tr7, the third column wire B3, a selected unit memory region, the second column wire B2 and the sixth transistor Tr6 of FIG. 11, and finally, to the ground. Thus, first information may be written to a first region of the selected memory region such as the first region R1 of FIGS. 1 and 2. If the first write signal $S_W1$ has a value of 1 and the second write signal $S_W2$ has a value of 0, the eighth transistor Tr8 of FIG. 12 may be turned on, the fifth transistor Tr5 of FIG. 11 may be turned on, and then, the write current may flow from the first write current source WCS1 of FIG. 11 to the fifth transistor Tr5, the second column wire B2, the selected unit memory region, the third column wire B3, the eighth transistor Tr8, and finally, to the ground. Accordingly, second information may be written to the first region of the selected unit memory region.

Figure 13:
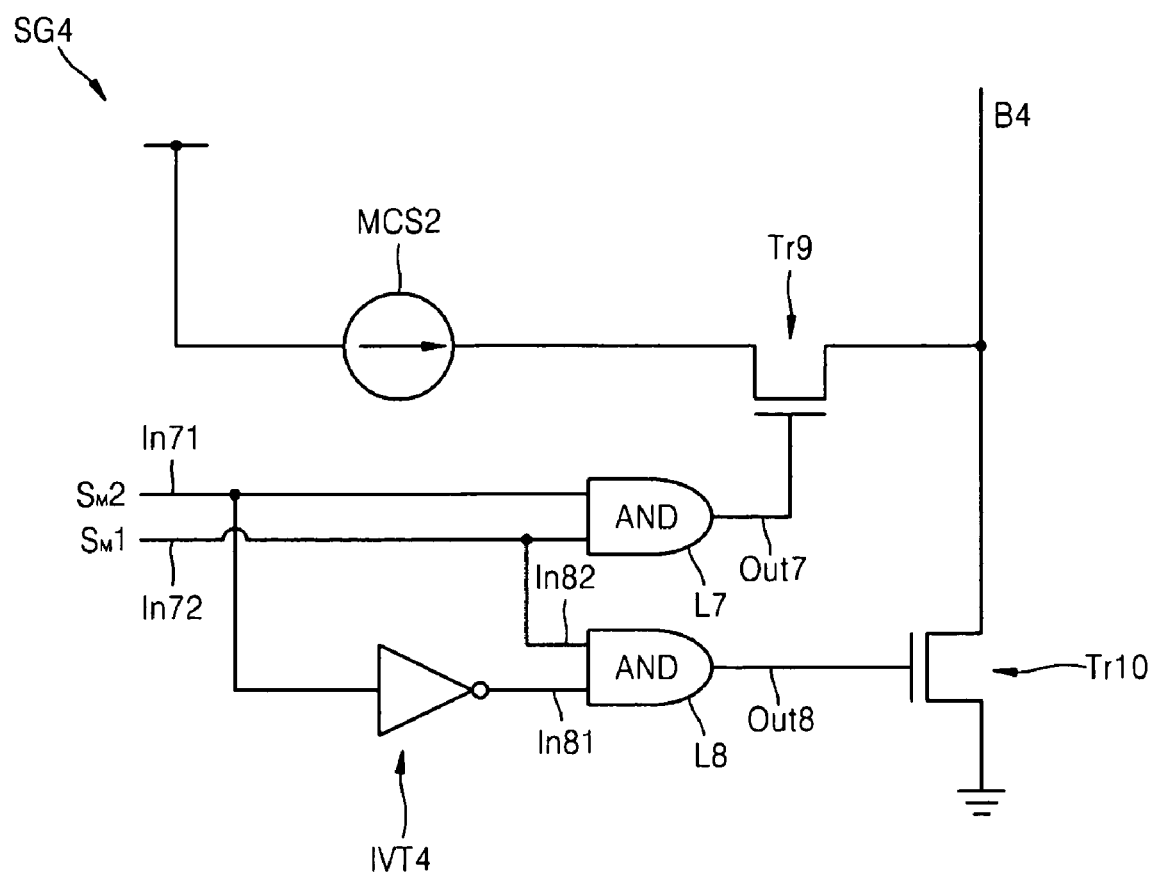

FIG. 13 is a circuit diagram of an embodiment of the fourth signal generator SG4 of FIG. 9. Referring to FIG. 13, a second moving-current source MCS2 may be connected to a fourth column wire B4 (e.g. a fourth interconnecting wire). A ninth transistor Tr9 may be connected between the second write current source WCS2 and the fourth column wire B4. A tenth transistor Tr10 may be connected in series to a lower part of the fourth column wire B4. An end of the tenth transistor Tr10 may be grounded. Seventh and eighth logic elements L7 and L8 may be connected to each other. The constructions and connections of the seventh and eighth logic elements L7 and L8 and the ninth and tenth transistors Tr9 and Tr10 may be similar to those of the fifth and sixth logic elements L5 and L6 and seventh and eighth transistors Tr7 and Tr8 of FIG. 12. Reference numerals In71, In72 and Out7 respectively denote first and second input terminals and an output terminal of the seventh logic element L7. Reference numerals In81, In82 and Out8 respectively denote first and second input terminals and an output terminal of the eighth logic element L8. A reference numeral IVT4 denotes a fourth inverter that is connected between the first input terminal In71 and the first input terminal In81.

First and second moving signals $S_M1$ and $S_M2$ may be respectively supplied to the second and first input terminals In72 and In71 of the seventh logic element L7. If both the first and second moving signals $S_M1$ and $S_M2$ have a value of 1, the ninth transistor Tr9 may be turned on, and moving current may flow from the second moving-current source MCS2 to the ninth transistor Tr9, the fourth column wire B4, and finally, to a unit memory region. Thus, the magnetic domain walls of the magnetic track 100 of FIG. 1 or 2 may be moved in a first direction. If the first and second moving signals $S_M1$ and $S_M2$ respectively have values of "1" and "0", the tenth transistor Tr10 may be turned on, and then, the moving current may flow from the unit memory region to the fourth column wire B4, the tenth transistor Tr10, and finally, to the ground. Accordingly, the magnetic domain walls of the magnetic track 100 may be moved in a second direction opposite to the first direction.

During the movement of the magnetic domain walls, the fourth signal generator SG4 of FIG. 13 may operate in association with the first signal generator SG1 of FIG. 10. When the ninth transistor Tr9 is turned on, the third transistor Tr3 of FIG. 10 is also turned on, and thus, the moving current may flow from the second moving-current source MCS2 to the fourth column wire B4, a selected unit memory region, the first column wire B1 of FIG. 10, the third transistor Tr3, and finally, to the ground. Thus, the magnetic domain walls may be moved in the first direction. Also, when the tenth transistor Tr10 is turned on, the first transistor Tr1 of FIG. 10 is turned on, and thus, the moving current may flow from the first moving-current source MCS1 of FIG. 10 to the first column wire B1, the selected unit memory region, the fourth column wire B4, the tenth transistor Tr10, and finally, to the ground. Accordingly, the magnetic domain walls may be moved in the second direction.

Thus, after one of the unit memory regions MR is selected using the row decoder DCR1 and the column decoder DCR2 of FIG. 9, either a write/read operation may be performed on the selected unit memory region MR or the magnetic domain walls may be moved, using the first through fourth signal generators SG1 to SG4. The write/read operation or the movement of the magnetic domain walls may be performed in association with the operation of the first peripheral circuit 1000 of FIG. 9. More specifically, during write/read operation or the movement of the magnetic domain walls, the first moving signal $S_M1$ and the first read signal $S_R1$ may be respectively supplied to the first and second input terminals IN11 and IN12 of the first logic element LC1 of FIG. 9, and the first write signal $S_W1$ and the first read signal $S_R1$ may be respectively supplied to the first and second input terminals IN21 and IN22 of the second logic element LC2. If the first logic element LC1 is an OR gate, when at least one of the first moving signal $S_M1$ and the read signal $S_R1$ supplied to the first logic element LC1 has a value of 1, an operation signal may be supplied to the first word line WL1$_i$ connected to the selected unit memory region via the first row wire W1. Thus, the first and second switching devices T1 and T2 of FIG. 1 or 2, which are connected to the first word line WL1$_i$ of the selected unit memory region, may be turned on.

Similarly, if the second logic element LC2 is an OR gate, when at least one of the first write signal $S_W1$ and the read signal $S_R1$ supplied to the second logic element LC2 has a value of 1, an operation signal may be supplied to the second word line WL2$_i$ connected to the selected unit memory region via the second row wire W2.

The third switching device T3, which is connected to the second word line WL2$_i$ of the selected unit memory region, may be turned on. The third switching device T3 is turned on to write information (e.g. see also FIG. 4). The first and second switching devices T1 and T2 are turned on to move the magnetic domain walls (e.g. see also FIG. 5). The first and third switching devices T1 and T3 are turned on to read information (e.g. see also FIG. 6).

The information storage device of FIG. 9 is constructed to perform the above operations. For example, when both the first write signal $S_W1$ supplied to the second signal generator SG2 and the second write signal $S_W2$ supplied to the third signal generator SG3 in order to write first information have a value of 1, the first write signal $S_W1$ supplied to the first input terminal IN21 of the second logic element LC2 has a value of 1. Thus, the third switching device T3 connected to the second word line WL2$_i$ that is connected to the selected unit memory region, may be turned on via the second row wire W2.

When the first write signal $S_W1$ supplied to the second signal generator SG2 and the second write signal $S_W2$ supplied to the third signal generator SG3 in order to write second information respectively have a value of 1 and a value of 0, the first write signal $S_W1$ supplied to the first input terminal IN21 of the second logic element LC2 also has a value of 1. Then, the third switching device T3 connected to the second word line WL2$_i$ that is connected to the selected unit memory region may be turned on.

If the read signal $S_R1$ supplied to the first and second signal generators SG1 and SG2 in order to read information has a value of 1, the read signal $S_R1$ supplied to the second input terminals IN12 and IN22 of the first and second logic elements LC1 and LC2 has a value of 1. Thus, the first to third switching devices T1 to T3 connected to the first and second word lines WL1$_i$ and WL2$_i$ connected to the selected unit memory region may be turned on via the first and second row wires W1 and W2.

Also, in order to move the magnetic domain walls in the first direction, when both the first moving signal $S_M1$ supplied to the first signal generator SG1 and the second moving signal $S_M2$ supplied to the fourth signal generator SG4 have a value of 1, the first moving signal $S_M1$ supplied to the first input terminal IN11 of the first logic element LC1 has a value of 1. Thus, the first and second switching devices T1 and T2 connected to the first word line WL1$_i$ connected to the selected unit memory region may be turned on via the first row wire W1. In order to move the magnetic domain walls in the second direction opposite to the first direction, when the first moving signal $S_M1$ supplied to the first signal generator SG1 and the second moving signal $S_M2$ supplied to the fourth signal generator SG4 respectively have a value of 1 and a value of 0, the first moving signal $S_M1$ supplied to the first input terminal IN11 of the first logic element LC1 has a value of 1. Thus, the first and second switching devices T1 and T2 connected to the first word line WL1$_i$ connected to the selected unit memory region may be turned on. As described above, a write/read operation may be performed on a unit memory region selected according to the operations of the first and second peripheral circuits 1000 and 2000, which are associated with each other.

Figure 14:
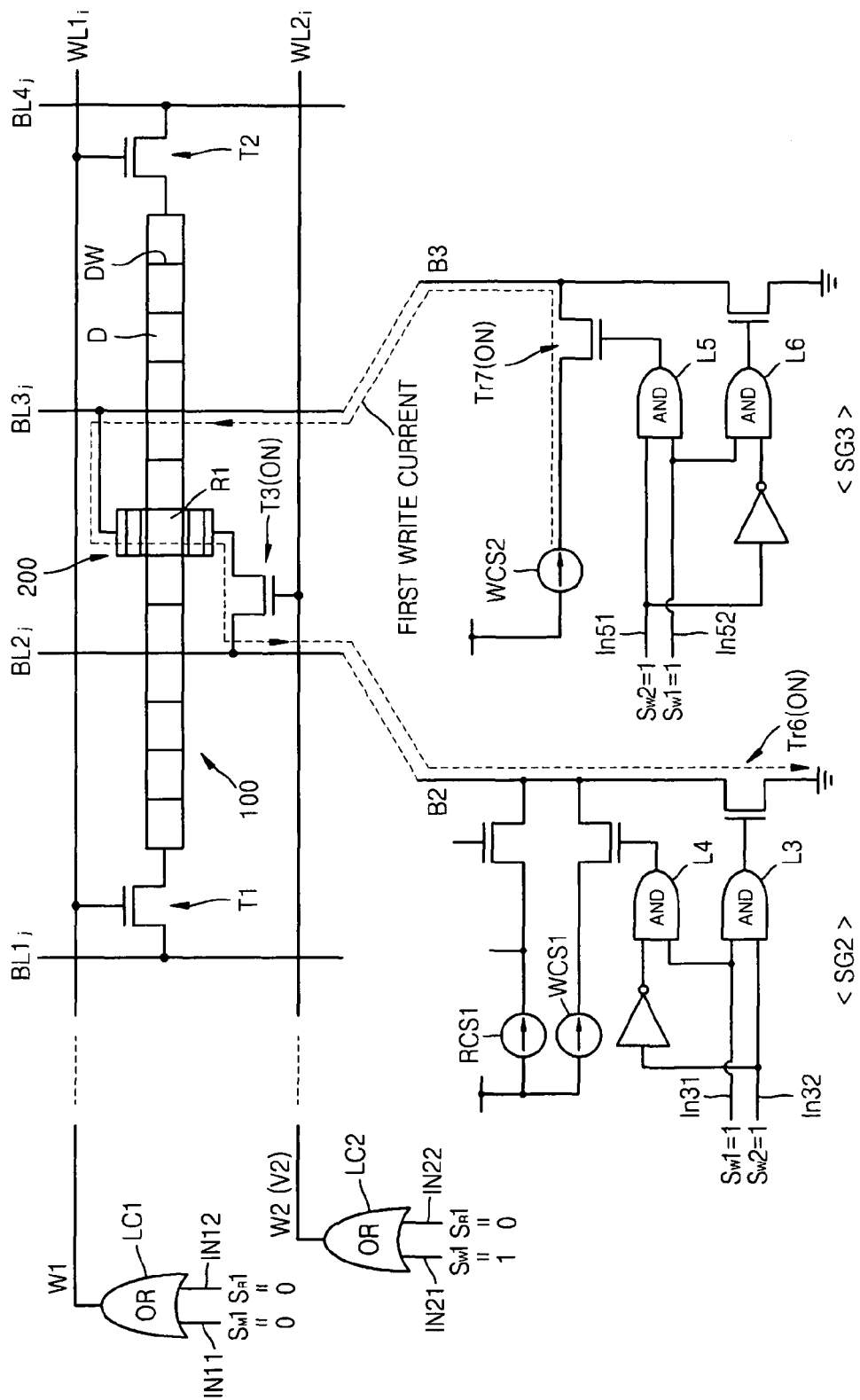
FIGS. 14 to 18 illustrate an example embodiment of a method of operating the information storage device of FIG. 9.
Figure 15:
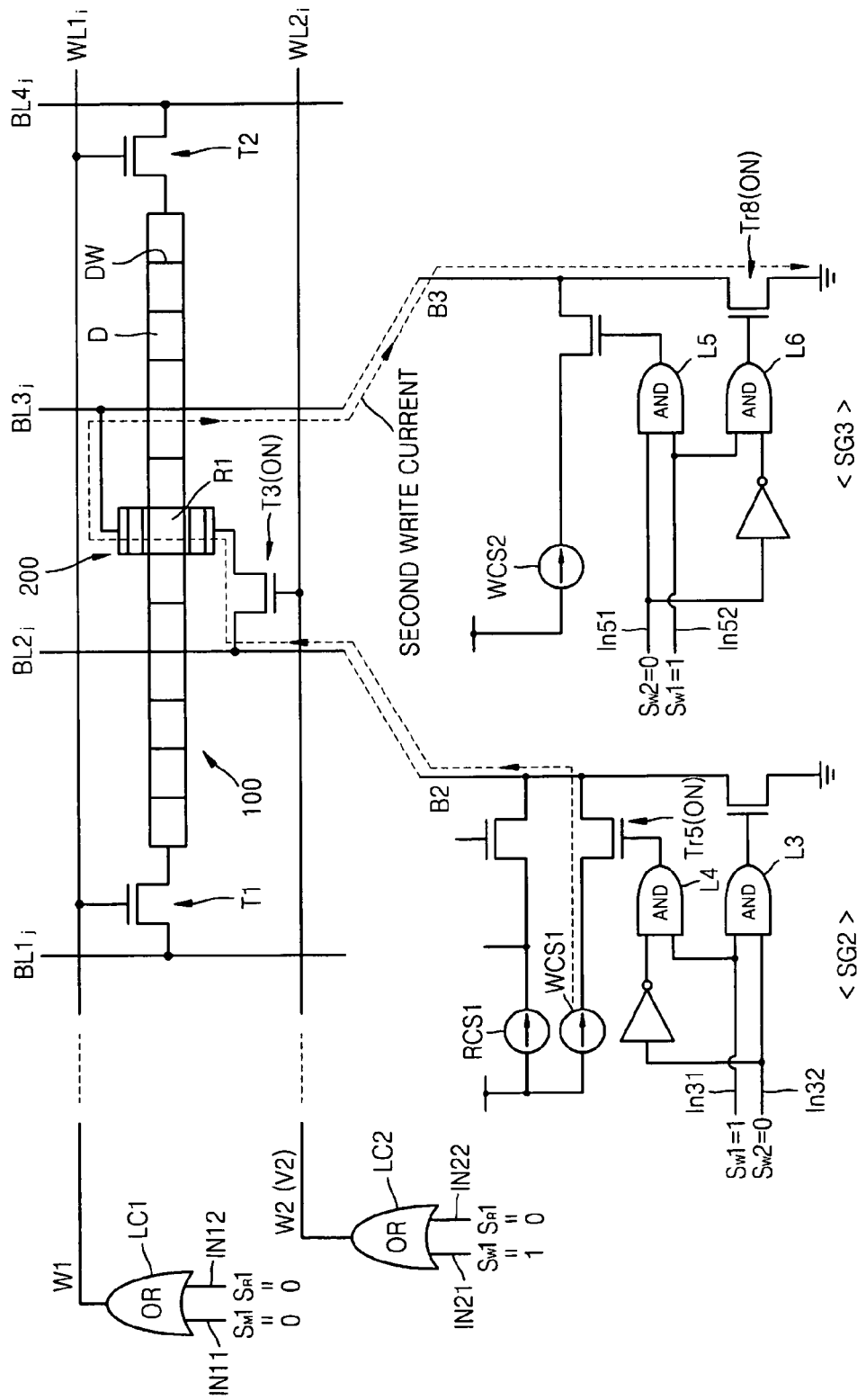
Figure 16:
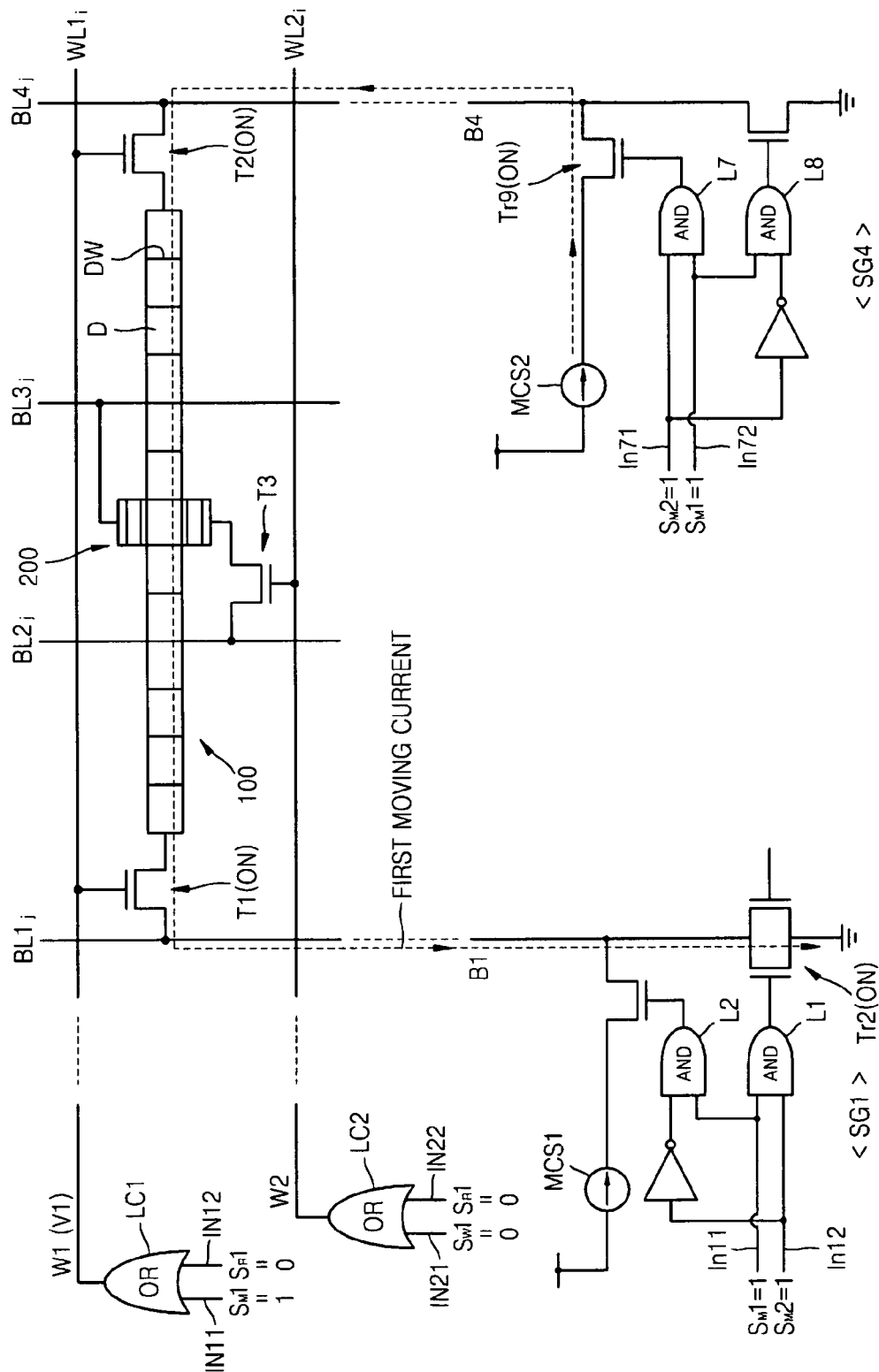
Figure 17:
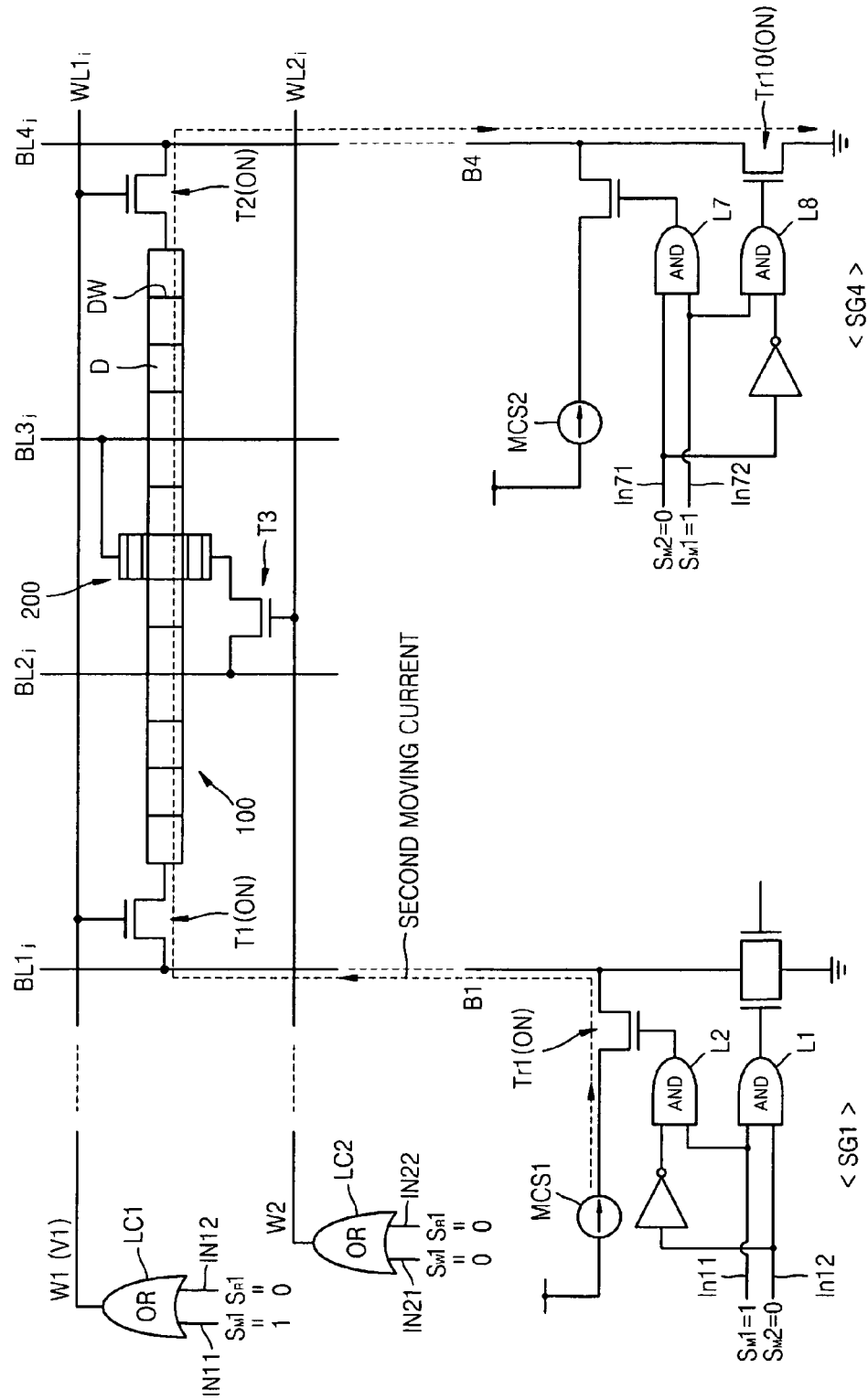
Figure 18:
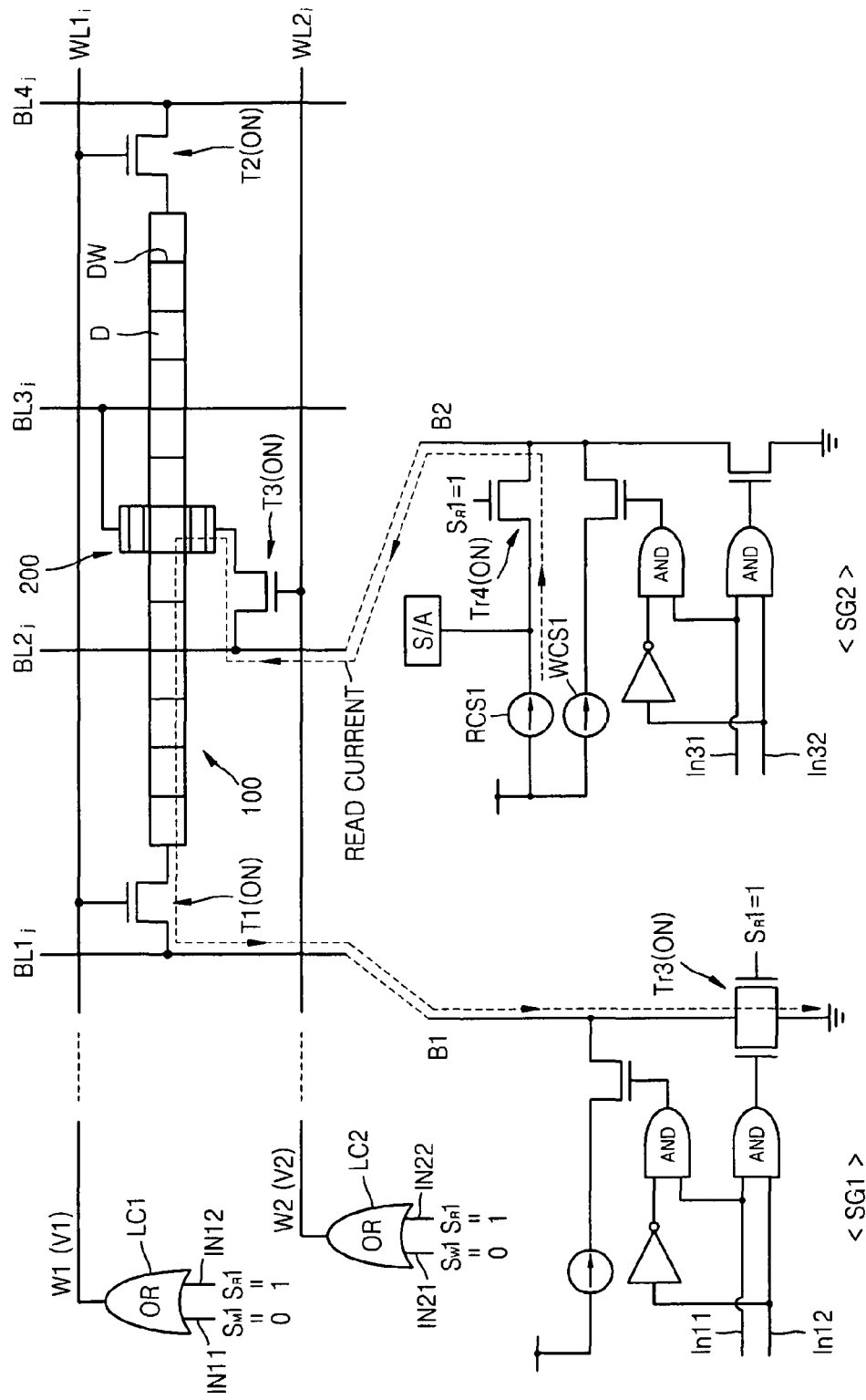

The above embodiments of write and read operations are as illustrated in FIGS. 14 through 18. FIGS. 14 and 15 illustrate a write operation. FIGS. 16 and 17 illustrate movement of magnetic domain walls. FIG. 18 illustrates a read operation.

Referring to FIG. 14, both first and second write signals $S_W1$ and $S_W2$ being supplied to the second and third signal generators SG2 and SG3 may have a value of 1, and the first write signal $S_W1$ supplied to the first input terminal IN21 of the second logic element LC2 may have a value of 1. In this case, the seventh transistor Tr7 of the third signal generator SG3, the sixth transistor Tr6 of the second signal generator SG2, and the third switching device T3 of a selected unit memory region may be turned on. Thus, first write current may flow from the second write current source WCS2 to the seventh transistor Tr7, the third column wire B3, the selected unit memory region, the second column wire B2, the sixth transistor Tr6, and finally, to the ground. Thus, first information may be written to the first region R1 of the selected unit memory region. Writing the first information may also be described with reference to the description of FIG. 3A.

Referring to FIG. 15, the first write signal $S_W1$ supplied to the second and the second write signal $S_W2$ supplied to the second signal generator SG2 and the third signal generator SG3 may respectively have a value of 1 and a value of 0. The first write signal $S_W1$ supplied to the first input terminal IN21 of the second logic element LC2 may have the value of 1. In this case, the fifth transistor Tr5 of the second signal generator SG2, the eighth transistor Tr8 of the third signal generator SG3, and the third switching device T3 of a selected unit memory region may be turned on as a result of the values of the first and second write signals $S_W1$-$S_W2$. Thus, second write current may flow from the first write current source WCS1 to the fifth transistor Tr5, the second column wire B2, the selected unit memory region, a third column wire B3, the eighth transistor Tr8, and finally, to the ground. Thus, second information may be written to the first region R1 of the selected unit memory region. Writing the second information may also be described with reference to the description of FIG. 3B.

Referring to FIG. 16, both first and second moving signals $S_M1$ and $S_M2$ input to the first and fourth signal generators SG1 and SG4 may have a value of 1. The first moving signal $S_M1$ having the value of 1 may be supplied to the first input terminal IN11 of the first logic element LC1. In this case, the ninth transistor Tr9 of the fourth signal generator SG4, the second transistor Tr2 of the first signal generator SG1, and first and second switching devices T1 and T2 of a selected unit memory region may be turned on. Thus, first moving current may flow from the second moving-current source MCS2 to the ninth transistor Tr9, the fourth column wire B4, the magnetic track 100 of the selected unit memory region, the first column wire B1, the second transistor Tr2, and finally, to the ground. Accordingly, magnetic domain walls of the magnetic track 100 may be moved in a first direction, i.e., in the right direction.

Referring to FIG. 17, the first moving signal $S_M1$ and the second moving signal $S_M2$ supplied to the fourth signal generator SG4 may respectively have a value of 1 and a value of 0. The first moving signal $S_M1$ supplied to the first input terminal IN11 of the first logic element LC1 may have the value of 1. In this case, the first transistor Tr1 of the first signal generator SG1, the tenth transistor Tr10 of the fourth signal generator SG4, and the first and second switching devices T1 and T2 of a selected unit memory region may be turned on. Thus, second moving current may flow from a first moving-current source MCS1 to the first transistor Tr1, the first column wire B1, the magnetic track 100 of the selected unit memory region, the fourth column wire B4, the tenth transistor Tr10, and finally, to the ground. Accordingly, magnetic domain walls of the magnetic track 100 may be moved in a second direction opposite to the first direction, i.e., in the left direction.

Referring to FIG. 18, a read signal $S_R1$ supplied to the first and second signal generators SG1 and SG2 may have a value of 1, and the read signal $S_R1$ supplied to the first and second logic elements LC1 and LC2 may have the value of 1. In this case, the fourth transistor Tr4 of the second signal generator SG2, the third transistor Tr3 of the first signal generator SG1, and the first to third switching devices T1 to T3 of a selected unit memory region may be turned on. Thus, read current may flow from a moving-current source RCS1 to the second column wire B2, the first unit 200 of the selected unit memory region, the first column wire B1, the third transistor Tr3, and finally to, the ground.

Figure 19:
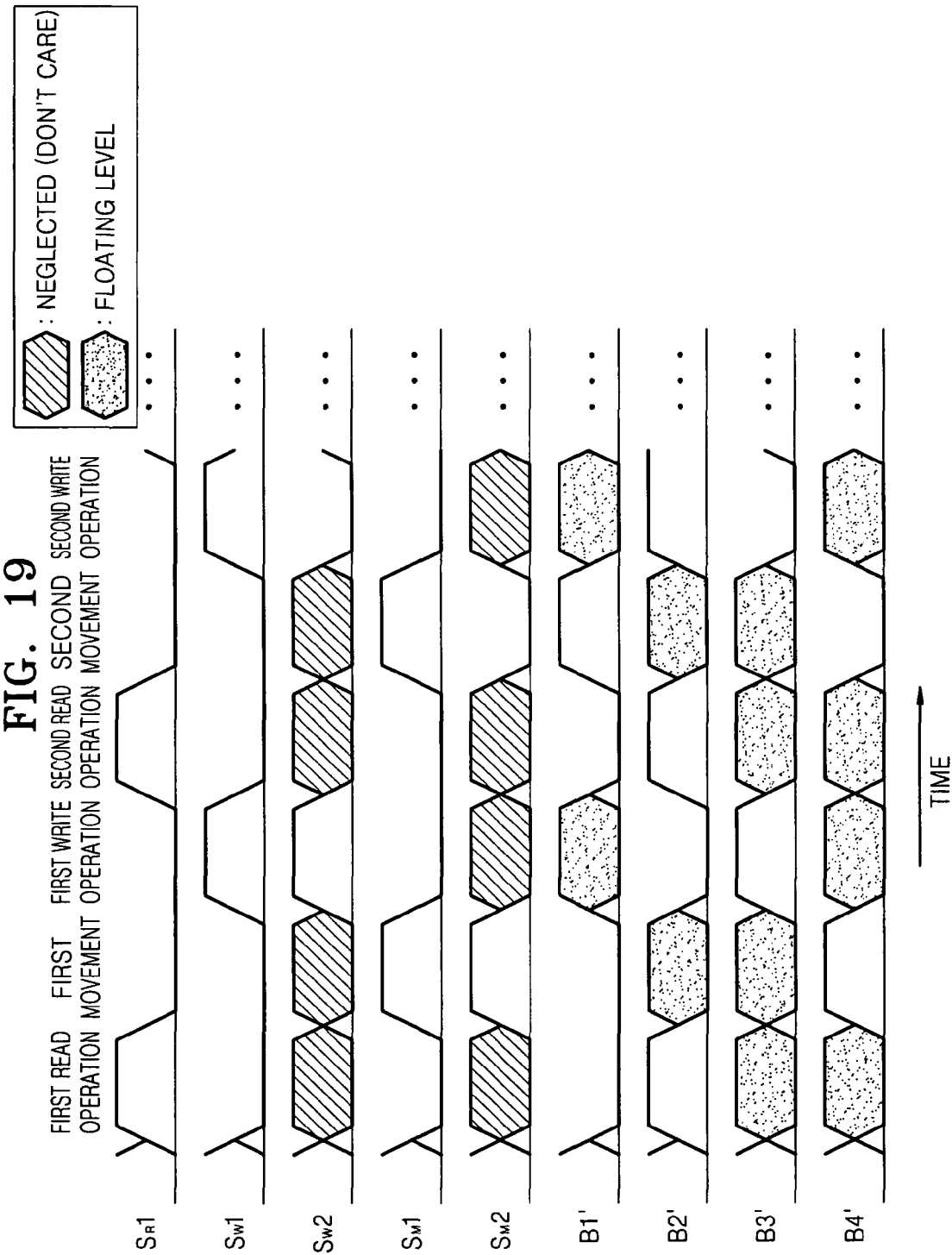
FIG. 19 is a waveform diagram of an example embodiment of an information storage device.

FIG. 19 is a waveform diagram of various input signals $S_R1$, $S_W1$, $S_W2$, $S_M1$, and $S_M2$ that may be used when operating an embodiment of an information storage device. FIG. 19 is also a waveform diagram of first through fourth current signals B1' to B4' which respectively flow through the first through fourth column wires B1 to B4 of FIG. 9. In FIG. 19, slanted patterns denote signals that are neglected, and dot patterns denote floating-level signals. These signals of FIG. 19 will now be described with reference to FIGS. 14 through 18.

Referring to FIG. 19, in a first read operation, the read signal $S_R1$ supplied to an information storage device may have a value of 1, and thus, the current signal B2' corresponding to '1' and the current signal B1' corresponding to '0' may be respectively supplied to a second column wire B2 and a first column wire B1. This means that read current may flow from the second column wire B2 to the first column wire B1 as illustrated in FIG. 18.

In first movement of magnetic domain walls, the first and second moving signals $S_M1$ and $S_M2$ having a value of 1 may be supplied to the information storage device, and thus, the current signal B1' corresponding to '0' and the current signal B4' corresponding to '1' may be respectively supplied to the first column wire B1 and the fourth column wire B4. This means that first moving current may flow from the fourth column wire B4 to the first column wire B1 as illustrated in FIG. 16.

In a first write operation, the first and second write signals $S_W1$ and $S_W2$ having a value of 1 may be supplied to the information storage device, and thus, the current signal B2' corresponding to '0' and the current signal B3' corresponding to '1' may be respectively supplied to the second column wire B2 and the third column wire B3. This means that first write current may flow from the third column wire B3 to the second column wire B2 as illustrated in FIG. 14.

A second read operation may be performed similar to the first read operation.

In second movement of the magnetic domain walls, the first and second moving signals $S_M1$ and $S_M2$ respectively having a value of 1 and a value of 0 may be supplied to the information storage device, and thus, the current signal B1' corresponding to '1' and the current signal B4' corresponding to '0' may be respectively supplied to the first column wire B1 and the fourth column wire B4. This means that second moving current may flow from the first column wire B1 to the fourth column wire B4 as illustrated in FIG. 17.

In a second write operation, the first and second write signals $S_W1$ and $S_W2$ having a value of 1 and a value of 0 may be supplied to the information storage device, and thus, the current signal B2' corresponding to '1' and the current signal B3' corresponding to '0' may be respectively supplied to the second column wire B2 and the third column wire B3. This means that second write current may flow from the second column wire B2 to the third column wire B3 as illustrated in FIG. 15. It should be understood that the signals of FIG. 19 are just illustrative examples and may be changed in various ways.

Figure 20:
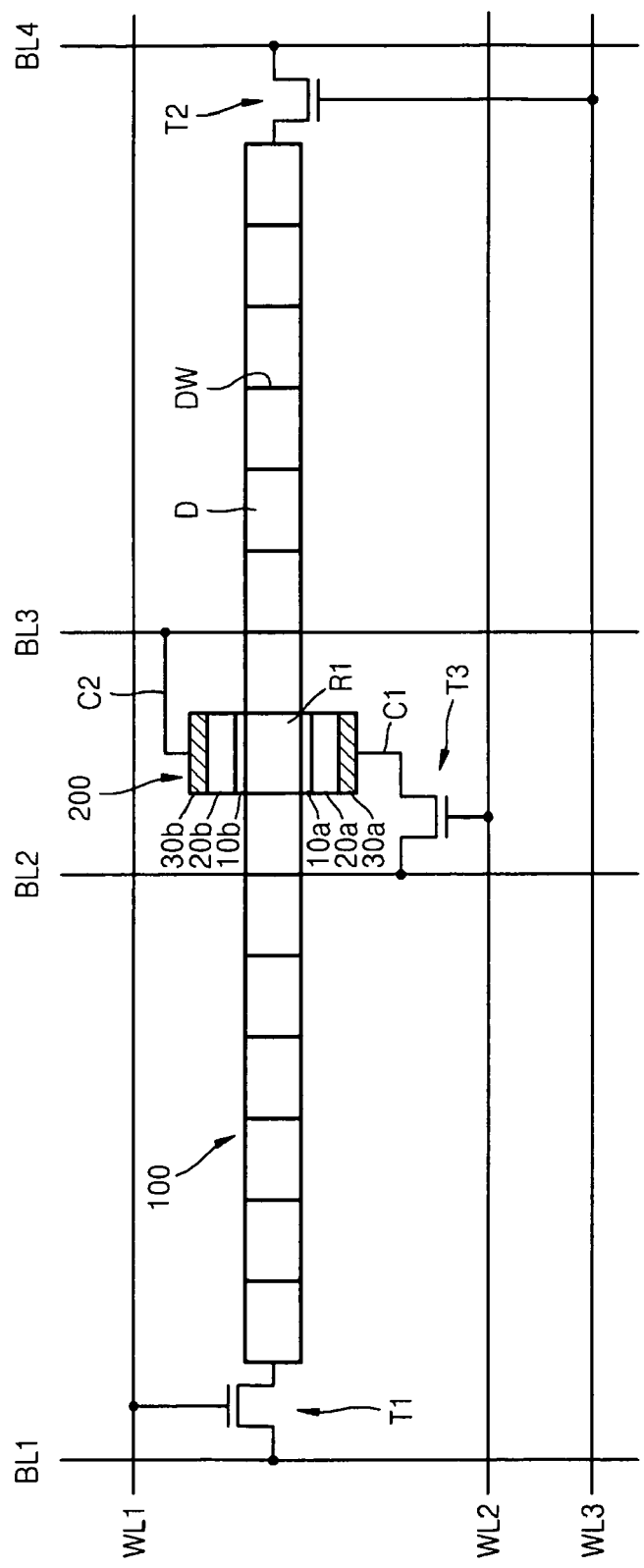
FIGS. 20 and 21 are circuit diagrams of other example embodiments of an information storage device.
Figure 21:
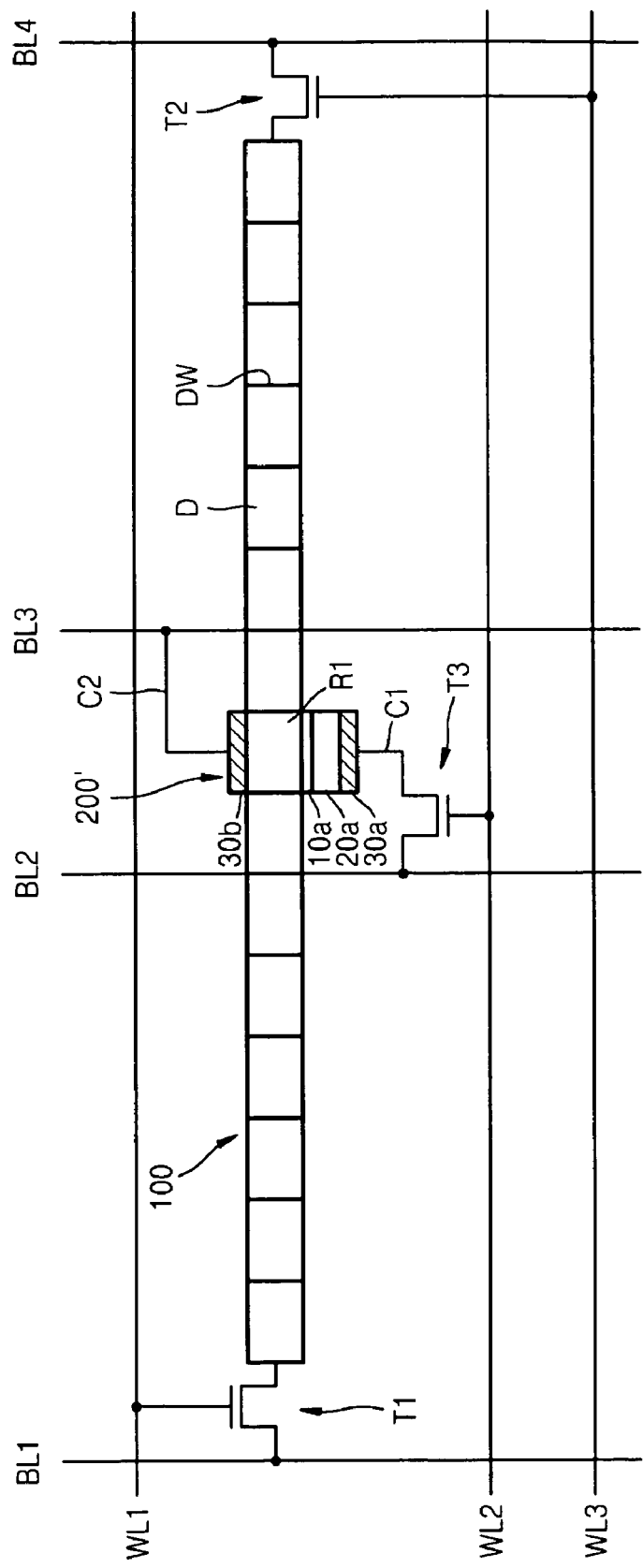

The above embodiments of an information storage device may be constructed in various ways. For example, although FIGS. 1 and 2 illustrate that the first and second switching devices T1 and T2 are commonly connected to the first word line WL1, the first and second switching devices T1 and T2 may be connected to another word line in another embodiment of the information storage device as illustrated in FIGS. 20 and 21. The information storage devices illustrated in FIGS. 20 and FIG. 21 are respectively modified examples of those illustrated in FIGS. 1 and 2.

Referring to FIGS. 20 and 21, a first switching device T1 may be connected to a first word line WL1, and a second switching device T2 may be connected to a third word line WL3. As the construction of a unit memory region in FIGS. 20 and 21 is different than as illustrated in FIGS. 1 and 2, those of the first and second peripheral circuits 1000 and 2000 illustrated in FIGS. 9 and 10 through 13 may also be changed and operate differently accordingly.

If the switching devices T1 and T2 are installed at both ends of a magnetic track 100 as illustrated in FIGS. 1, 2, 20 and 21, all magnetic tracks except for the magnetic track 100 that is to operate may not be influenced by operating current, thereby stably operating the information storage device without causing current disturbance. In particular, the integration degree when the first and second switching devices T1 and T2 are commonly connected to the first word line WL1 as illustrated in FIGS. 1 and 2 may be greatly improved than when the first and second switching devices T1 and T2 are respectively connected to the word lines WL1 and WL3 FIGS. 20 and 21.

It should be understood that the exemplary embodiments described therein should be considered in a descriptive sense only and not for purposes of limitation. For example, it would be obvious to those of ordinary skill in the art that in FIGS. 9 through 13, the first and second peripheral circuits 1000 and 200 may be constructed in various ways. Accordingly, the spirit and scope of this disclosure should be defined by the claims.

What is claimed is:
1. An information storage device comprising:
a magnetic track including a plurality of magnetic domain regions and magnetic domain wall regions between adjacent magnetic domain regions;

a write/read unit on a first region of the magnetic track, where first and second electrodes are disposed at first and second ends of the write/read unit, respectively;
first and second switching devices being respectively connected to first and second ends of the magnetic track;
a third switching device connected to the first electrode of the write/read unit; and
a circuit configured to control the first, second and third switching devices and supply current to at least one of the magnetic track and the write/read unit; wherein
the first, second and third switching devices are transistors,
gates of the first and second switching devices are connected to a first word line, and
a gate of the third switching device is connected to a second word line.

2. The device of claim 1, wherein the write/read unit is a tunnel magneto resistance (TMR) device or a giant magneto resistance (GMR) device.

3. The device of claim 1, wherein the write/read unit is disposed at a center part of the magnetic track.

4. An information storage device comprising:
a magnetic track including a plurality of magnetic domain regions and magnetic domain wall regions between adjacent magnetic domain regions;
a write/read unit on a first region of the magnetic track, where first and second electrodes are disposed at first and second ends of the write/read unit, respectively;
first and second switching devices being respectively connected to first and second ends of the magnetic track;
a third switching device connected to the first electrode of the write/read unit; and
a circuit configured to control the first, second and third switching devices and supply current to at least one of the magnetic track and the write/read unit;
first through fourth bit lines intersecting first and second word lines; wherein
the first switching device is connected to the first bit line and the first word line,
the second switching device is connected to the first word line and the fourth bit line,
the third switching device is connected to the second bit line and the second word line, and
the third bit line is connected to the second electrode of the write/read unit.

5. The device of claim 4, wherein the circuit comprises:
a first circuit connected to the first and second word lines; and
a second circuit connected to the first through fourth bit lines.

6. The device of claim 5, wherein the second circuit comprises first through fourth signal generators being respectively connected to the first through fourth bit lines and
a read operation performed by the write/read unit on the first region is controlled by the first and second signal generators,
a write operation performed by the write/read unit on the first region is controlled by the second and third signal generators, and
movement of the magnetic domain walls in the magnetic track is controlled by the first and fourth signal generators.

7. The device of claim 6, wherein the first circuit turns on the first to third switching devices during the read operation, turns on the third switching device during the write operation, and turns on the first and second switching devices during the movement of the magnetic domain walls.

8. The device of claim 6, wherein the first signal generator comprises:
a first moving-current source connected to a first interconnecting wire that is connected to the first bit line;
a first transistor disposed between the first moving-current source and the first interconnecting wire;
second and third transistors connected in parallel to the first interconnecting wire, an end of each the second and third transistors being grounded;
a first AND gate having an output terminal connected to the second transistor and first and second input terminals;
a second AND gate having an output terminal connected to the first transistor, first and second input terminals of the second AND gate being respectively connected to the first and second input terminals of the first AND gate; and
a first inverter disposed between the second input terminals of the first and second AND gates,
wherein moving signals for moving the magnetic domain walls are supplied to the first and second input terminals of the first AND gate, and a read signal is supplied to a gate terminal of the third transistor.

9. The device of claim 6, wherein the second signal generator comprises:
a read current source and a first write current source which are connected in parallel to a second interconnecting wire connected to the second bit line;
a fourth transistor disposed between the read current source and the second interconnecting wire;
a fifth transistor disposed between the first write current source and the second interconnecting wire;
a sixth transistor which is connected to the second interconnecting wire, an end of the sixth transistor being grounded;
a third AND gate having first and second input terminals and an output terminal connected to the sixth transistor;
a fourth AND gate having an output terminal connected to the fifth transistor, and first and second input terminals being respectively connected to the first and second input terminals of the third AND gate; and
a second inverter disposed between the second input terminals of the third and fourth AND gates,
wherein write signals are supplied to the first and second input terminals of the third AND gate and a read signal is supplied to a gate terminal of the fourth transistor.

10. The device of claim 6, wherein the third signal generator comprises:
a second write current source connected to a third interconnecting wire that is connected to the third bit line;
a seventh transistor disposed between the second write current source and the third interconnecting wire;
an eighth transistor connected to the third interconnecting wire, an end of the eighth transistor being grounded;
a fifth AND gate having first and second input terminals and an output terminal connected to the seventh transistor;
a sixth AND gate having an output terminal connected to the eighth transistor and first and second input terminals being respectively connected to the first and second input terminals of the fifth AND gate; and
a third inverter disposed between the first input terminals of the fifth and sixth AND gates,
wherein write signals are supplied to the first and second input terminals of the fifth AND gate.

11. The device of claim 6, wherein the fourth signal generator comprises:

a second moving-current source connected to a fourth interconnecting wire that is connected to the fourth bit line;
a ninth transistor disposed between the second moving-current source and the fourth interconnecting wire;
a tenth transistor which is connected to the fourth interconnecting wire, an end of the tenth transistor being grounded;
a seventh AND gate having first and second input terminals and an output terminal connected to the ninth transistor;
an eighth AND gate having an output terminal connected to the tenth transistor, and first and second input terminals being respectively connected to the first and second input terminals of the seventh AND gate; and
a fourth inverter disposed between the first input terminals of the seventh and eighth AND gates,
wherein moving signals for moving the magnetic domain walls are supplied to the first and second input terminals of the seventh AND gate.

12. The device of claim 7, wherein the first circuit comprises:
a first OR gate including an output terminal connected to the first word line; and
a second OR gate including an output terminal connected to the second word line,
wherein a moving signal and a read signal are respectively supplied to first and second input terminals of the first OR gate, and a write signal and the read signal are respectively supplied to first and second input terminals of the second OR gate.

13. The device of claim 5, wherein a unit memory region includes the magnetic track, the first and second word lines, the first through fourth bit lines and the first, second and third switching devices form one unit memory region together, and
a memory array includes a plurality of unit memory regions.

14. The device of claim 13, wherein a first decoder is disposed between the first circuit and the memory array, and
a second decoder is disposed between the second circuit and the memory array.

15. An information storage device comprising:
a magnetic track including a plurality of magnetic domain regions and magnetic domain wall regions between adjacent magnetic domain regions;
a write/read unit on a first region of the magnetic track, where first and second electrodes are disposed at first and second ends of the write/read unit, respectively;
first and second switching devices being respectively connected to first and second ends of the magnetic track;
a third switching device connected to the first electrode of the write/read unit; and
a circuit configured to control the first, second and third switching devices and supply current to at least one of the magnetic track and the write/read unit; wherein
the first, second and third switching devices are transistors, and
the gates of the first, second and third switching devices are respectively connected to different word lines.

16. A method of operating an information storage device including,
a magnetic track including a plurality of magnetic domain regions and magnetic domain wall regions between adjacent magnetic domain regions,
a write/read unit on a first region of the magnetic track, where first and second electrodes are disposed at first and second ends of the write/read unit, respectively,
first and second switching devices being respectively connected to first and second ends of the magnetic track,
a third switching device connected to the first electrode of the write/read unit, and
a circuit configured to control the first, second and third switching devices and supply current to at least one of the magnetic track and the write/read unit,
wherein the first, second and third switching devices are transistors,
wherein gates of the first and second switching devices are connected to a first word line, and
wherein a gate of the third switching device is connected to a second word line, the method comprising:
turning on at least one of the first, second and third switching devices; and
supplying current to at least one of the magnetic track and the write/read unit.

17. The method of claim 16, wherein first through fourth bit lines intersect the first and second word lines,
wherein the first bit line is connected to the first switching device,
the second bit line is connected to the third switching device,
the third bit line is connected to the second electrode of the write/read unit, and
the fourth bit line is connected to the second switching device.

18. The method of claim 17, wherein the circuit region comprises:
a first circuit connected to the first and second word lines; and
a second circuit connected to the first through fourth bit lines.

19. The method of claim 18, wherein the second circuit comprises first through fourth signal generators being respectively connected to the first through fourth bit lines and
a read operation performed by the write/read unit on the first region is controlled by the first and second signal generators,
a write operation performed by the write/read unit on the first region is controlled by the second and third signal generators, and
movement of the magnetic domain walls in the magnetic track is controlled by the first and fourth signal generators.

20. The method of claim 19, wherein turning on includes turning on the first, second and third switching devices, and
supplying read current to the first signal generator through the write/read unit from the second signal generator.

21. The method of claim 19, wherein turning on includes turning on the third switching device, and
supplying write current to one of the second and third signal generators through the write/read unit from the other one of the second and third signal generators.

22. The method of claim 19, wherein turning on includes turning on the first and second switching devices, and
supplying moving current to one of the first and fourth signal generators through the magnetic track from the other one of the first and fourth signal generators.

23. The method of claim 16, wherein the current is read current, write current, or moving current for moving magnetic domain walls of the magnetic track.

* * * * *